United States Patent
Takamiya et al.

(10) Patent No.: US 8,614,755 B2
(45) Date of Patent: Dec. 24, 2013

(54) OPTICAL DEVICE AND SIGNAL PROCESSOR

(75) Inventors: Makoto Takamiya, Tokyo (JP); Akihiko Nagano, Ichihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 176 days.

(21) Appl. No.: 13/144,840

(22) PCT Filed: Feb. 23, 2010

(86) PCT No.: PCT/JP2010/053184
§ 371 (c)(1),
(2), (4) Date: Jul. 15, 2011

(87) PCT Pub. No.: WO2010/101096
PCT Pub. Date: Sep. 10, 2010

(65) Prior Publication Data
US 2011/0273602 A1    Nov. 10, 2011

(30) Foreign Application Priority Data
Mar. 2, 2009    (JP) .................... 2009-047940

(51) Int. Cl.
H04N 5/232    (2006.01)
H04N 9/083    (2006.01)
H04N 3/14    (2006.01)
H04N 5/335    (2011.01)
H04N 3/16    (2006.01)
G03B 13/00    (2006.01)

(52) U.S. Cl.
USPC .......................................... 348/277; 348/349

(58) Field of Classification Search
USPC .................................. 348/277, 349
See application file for complete search history.

(56) References Cited

U.S. PATENT DOCUMENTS

| 4,410,804 A | 10/1983 | Stauffer |
| 5,128,705 A | 7/1992 | Someya et al. |
| 5,367,153 A | 11/1994 | Suda et al. |
| 5,422,700 A | 6/1995 | Suda et al. |
| 5,473,403 A | 12/1995 | Suda et al. |

(Continued)

FOREIGN PATENT DOCUMENTS

| JP | 58-024105 A | 2/1983 |
| JP | 05-127074 | 5/1993 |

(Continued)

OTHER PUBLICATIONS

Office Action, dated Nov. 6, 2012, in Japanese Patent Application No. 2009-047940.

*Primary Examiner* — Tuan Ho
*Assistant Examiner* — Shahbaz Nazrul
(74) *Attorney, Agent, or Firm* — Fitzpatrick, Cella, Harper & Scinto

(57) ABSTRACT

A camera 200 comprises an image pickup element 107 which has imaging pixels performing a photoelectric conversion of an object image formed by a light beam emitted from an image pickup optical system and focus detection pixels performing a photoelectric conversion of two images formed by two divided light beams, a focus detector which obtains first and second pairs of image signals having optical base lengths different from each other from the focus detection pixels, a selector which selects one of the first and second pairs of image signals based on at least one correlation amount of the first and second pairs of image signals, and a calculator which calculates a defocus amount based on the selected pair of image signals.

7 Claims, 18 Drawing Sheets

(56) References Cited

U.S. PATENT DOCUMENTS

| | | | |
|---|---|---|---|
| 5,692,222 | A | 11/1997 | Yamada et al. |
| 5,696,998 | A | 12/1997 | Yamada et al. |
| 5,955,753 | A | 9/1999 | Takahashi |
| 6,829,008 | B1 | 12/2004 | Kondo et al. |
| 8,305,483 | B2 * | 11/2012 | Fujii et al. .............. 348/345 |
| 2001/0036361 | A1 | 11/2001 | Suda |
| 2007/0237511 | A1 * | 10/2007 | Kusaka .............. 396/111 |
| 2011/0008031 | A1 * | 1/2011 | Kusaka .............. 396/100 |
| 2011/0169997 | A1 * | 7/2011 | Nagano et al. .......... 348/340 |

FOREIGN PATENT DOCUMENTS

| | | |
|---|---|---|
| JP | 9-046596 | 2/1997 |
| JP | 10-153750 A | 6/1998 |
| JP | 11-153750 | 6/1999 |
| JP | 11-223759 | 8/1999 |
| JP | 2000-156823 | 6/2000 |
| JP | 2001-305415 | 10/2001 |
| JP | 2003-244712 | 8/2003 |
| JP | 2005-106994 | 4/2005 |
| JP | 2007-279312 | 10/2007 |
| JP | 2007-317951 A | 12/2007 |

* cited by examiner

OPTICAL DEVICE AND SIGNAL PROCESSOR

TECHNICAL FIELD

The present invention relates to an optical device such as a digital still camera capable of performing focus detection of an imaging lens.

BACKGROUND ART

As one of focus detection methods of an imaging lens, Patent Literature 1 discloses an apparatus of performing focus detection by a pupil division method using a two-dimensional sensor where a micro lens is formed in each pixel of the sensor. In the apparatus disclosed in Patent Literature 1, a photoelectric converter of each pixel which constitutes the sensor is divided into a plurality of photoelectric converters. The divided photoelectric converters are configured so as to receive light in regions having pupils of an imaging lens different from each other via a micro lens.

Patent Literature 2 discloses an image pickup device which performs a pupil division by displacing a sensitivity center of a light receiving unit with respect to an optical axis of an on-chip micro lens in a light receiving element (pixel) of a part of an image pickup element. These pixels are arranged between imaging pixel groups at a predetermined interval as focus detection pixels so that phase difference focus detection is performed. Since the region where the focus detection pixel is arranged corresponds to a defect of the imaging pixel, image information is created by performing an interpolation of the information using peripheral imaging pixel information.

Patent Literature 3 discloses a focus detection device which performs a pupil division of two divisions of a light receiving unit of pixels of a part of an image pickup element. The focus detection device performs phase difference focus detection by independently processing outputs of the light receiving unit for which two divisions have been performed and also adds the outputs of the two-divided light receiving unit to use it as an imaging signal.

Patent Literature 4 discloses a method of performing focus detection by performing a correlation calculation of an image generated from light beams transmitted through different pupil regions of an imaging lens.

CITATION LIST

Patent Literature

[PTL 1] Japanese Patent Laid-open No. 58-24105 (page 2, FIG. 1)
[PTL 2] Japanese Patent Laid-open No. 2000-156823 (paragraphs 0075 to 0079, FIGS. 3 and 4, etc.)
[PTL 3] Japanese Patent Laid-open No. 2001-305415 (paragraphs 0052 to 0056, FIGS. 7 and 8, etc.)
[PTL 4] Japanese Patent Laid-open No. 5-127074 (page 15, FIG. 34)

SUMMARY OF INVENTION

Technical Problem

In the phase difference focus detector described above, it is known that sensitivity of blur of focus is improved and focus detection accuracy is improved as a difference of displacements of sensitivity centers of light receiving units is large. However, when the displacement of the sensitivity center is large, the influence of the vignetting on an exit pupil of a lens is large.

FIG. 15 is a view showing light sensitivity of a pixel which performs the focus detection as disclosed in Patent Literature 2. In the drawing, a horizontal axis is a horizontal position on a pupil plane, which is parallel to an image pickup element surface, at a remove of a predetermined distance (for example, 100 mm) from the image pickup element, and a vertical axis is the light sensitivity. Accordingly, it is an image which is formed by projecting the light sensitivity of the image pickup element onto the pupil plane of 100 mm, and indicates the light sensitivity of each of two photoelectric conversion elements whose openings at center image height pixels are different (in the drawing, they are referred to as A image sensitivity and B image sensitivity, respectively).

In this example, a sensitivity peak of each of the A image and the B image is displaced by around 5 mm, and a displacement amount (referred to as an optical base length) of the sensitivity center of the A and B images is set to around 10 mm at a remove of 100 mm.

FIG. 15 shows how the line image is blurred depending on a pixel for performing the focus detection having such sensitivity. When the image is in focus, similar shape images which are close to an impulse shape can be obtained for both the A and B images.

FIGS. 16A and 16B show states of the A image and the B image while the focus is gradually displaced. FIGS. 16A and 16B shows cases where the focus states are displaced at a rear focus state and a front focus state, respectively.

As shown in FIGS. 16A and 16B, when the focus is greatly displaced, an image position as well as an image blur is greatly displaced. Therefore, in order to certainly perform focus detection, an extremely-large focus detection viewing field is necessary. In other words, when a large amount of blur is generated, a displacement of the image is extremely large and a region where a correlation calculation is performed, i.e. a viewing field length, is large. Accordingly, there is a problem that the maximum defocus amount by which the focus detection is capable of being performed cannot be enlarged if a calculation length is limited.

In order to solve these problems, a method of uniformly reducing a difference of displacement of the sensitivity centers of the light receiving units (shortening the optical base length) is considered, but a focus position cannot be detected with high accuracy because the optical base length is short near the focus. In other words, near the focus, the improvements of focus detection accuracy and the maximum defocus amount near the focus have a trade-off relation.

The present invention provides an optical device capable of improving the maximum defocus amount and also ensuring the focus detection accuracy near the focus.

Solution to Problem

An optical device as one aspect of the present invention comprises an image pickup element which has a plurality of imaging pixels configured to perform a photoelectric conversion of an object image formed by a light beam emitted from an image pickup optical system and a plurality of focus detection pixels configured to perform a photoelectric conversion of two images formed by two divided light beams of the light beam emitted from the image pickup optical system, a focus detector configured to obtain first and second pairs of image signals having optical base lengths different from each other from the plurality of focus detection pixels, a selector configured to select one of the first and second pairs of image signals based on at least one correlation amount of the first and second pairs of image signals, and a calculator configured to calculate a defocus amount based on the selected pair of image signals.

A signal processor as another aspect of the present invention is used for an optical device including an image pickup element which has a plurality of imaging pixels configured to perform a photoelectric conversion of an object image formed by a light beam emitted from an image pickup optical system, and has a plurality of focus detection pixels configured to perform a photoelectric conversion of two images formed by two divided light beams of the light beam emitted from the image pickup optical system. The signal processor comprises a focus detector configured to obtain first and second pairs of image signals having optical base lengths different from each other from the plurality of focus detection pixels, a selector configured to select one of the first and second pairs of image signals based on at least one correlation amount of the first and second pairs of image signals, and a calculator configured to calculate a defocus amount based on the selected pair of image signals.

Further features and aspects of the present invention will become apparent from the following description of exemplary embodiments with reference to the attached drawings.

Advantageous Effects of Invention

According to the present invention, an optical device capable of improving the maximum defocus amount and also ensuring focus detection accuracy near the focus can be provided.

DESCRIPTION OF EMBODIMENTS

Figure 1:
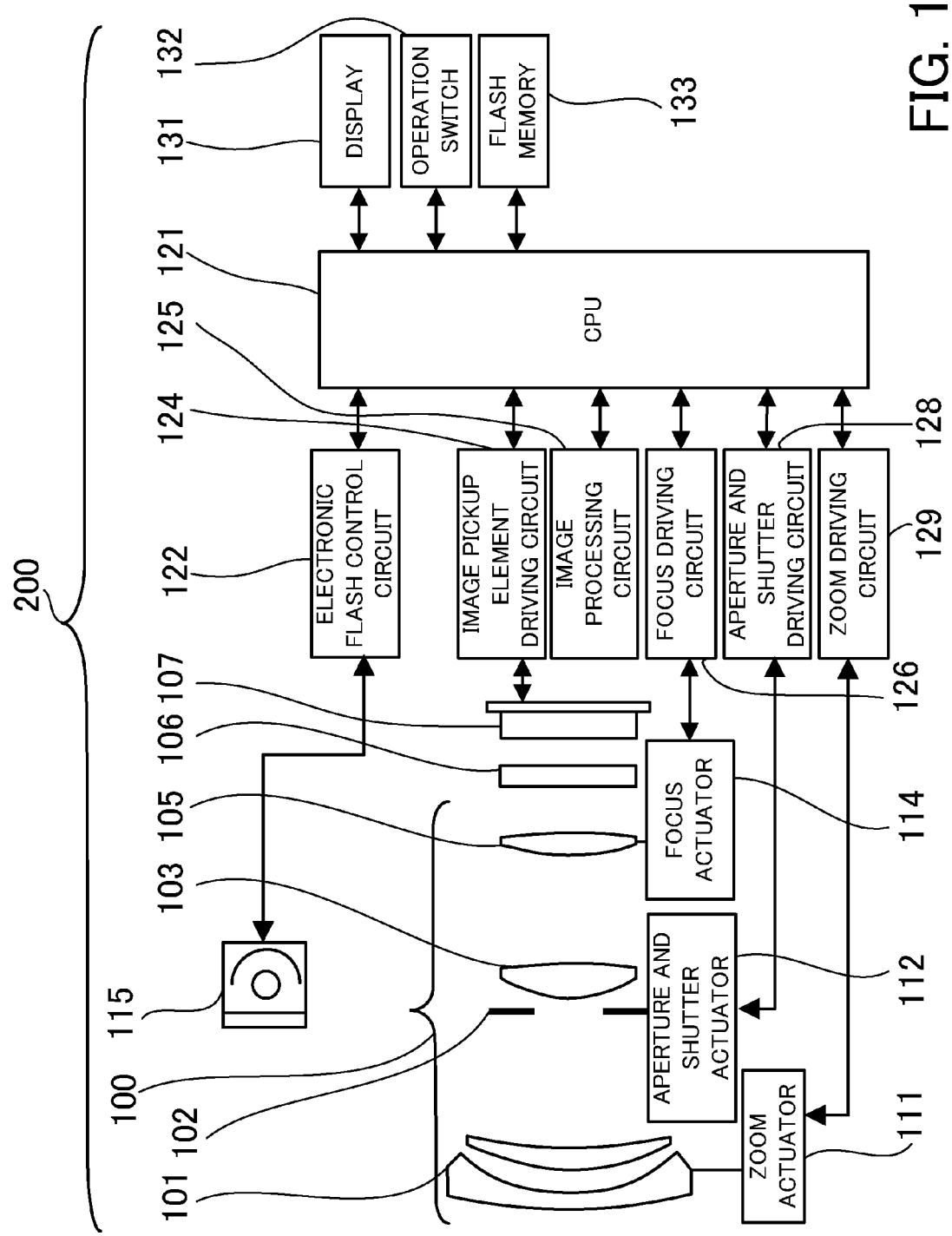
FIG. 1 is a configuration diagram of a camera in the present embodiment.

Exemplary embodiments of the present invention will be described below with reference to the accompanied drawings. In each of the drawings, the same elements will be denoted by the same reference numerals and the duplicate descriptions thereof will be omitted.

Embodiment 1

First, Embodiment 1 of the present invention will be described.

FIG. 1 is a configuration diagram of a camera 200 (an optical device) in the present embodiment. The camera 200 is an electronic camera which is constituted by integrating a camera body having an image pickup element that is an imaging unit and an imaging lens. The present embodiment is not limited to this, but can also be applied to an optical device in which the imaging lens is detachable from the camera body.

In FIG. 1, reference numeral 100 denotes an imaging lens. The imaging lens 100 constitutes an image pickup optical system which forms an object image. Reference numeral 101 denotes a first lens group which is disposed at an end part of the imaging lens 100. The first lens group is held so as to be movable backward and forward in an optical axis direction. Reference numeral 102 denotes a shutter with an aperture. The shutter with an aperture 102 performs a light intensity adjustment at the time of imaging by adjusting its opening diameter and also has a function of an exposure time adjusting shutter. Reference numeral 103 denotes a second lens group. The shutter with an aperture 102 and the second lens group 103 integrally move backward and forward in the optical axis direction, and take a magnification action (zoom function) in conjunction with the movement of the first lens group 101.

Reference numeral 105 denotes a third lens group. The third lens group 105 is a focus adjusting optical system which performs focus detection by moving backward and forward in the optical axis direction. Reference numeral 106 denotes an optical low-pass filter. The optical low-pass filter 106 is an optical element for reducing a false color or a moire of an image. Reference numeral 107 denotes an image pickup element which is constituted by a CMOS sensor and its peripheral circuit. The image pickup element 107 is provided with one photoelectric conversion element disposed on light receiving pixels of m pixels in a horizontal direction and n pixels in a vertical direction. The image pickup element 107 includes a plurality of imaging pixels which perform photoelectric conversion of an object image formed by a light beam emitted from the image pickup optical system. Further, the image pickup element 107 includes a plurality of focus detection pixels (first, second, and third focus detection pixels) which perform photoelectric conversion of two images formed by two-divided light beams of the light beam emitted from the image pickup optical system (pupil division).

Reference numeral 111 denotes a zoom actuator. The zoom actuator 111 rotates a cam cylinder (not shown) to perform a drive of the first lens group 101 and the second lens group 103 backward and forward in the optical axis direction to take a magnification action. Reference numeral 112 denotes an aperture and shutter actuator. The aperture and shutter actuator 112 controls the opening diameter of the shutter with an aperture 102 to adjust an imaging light intensity and also performs an exposure time control at the time of imaging a still image. Reference numeral 114 denotes a focus actuator.

The focus actuator 114 performs a drive of the third lens group 105 backward and forward in the optical axis direction to perform a focus adjustment.

Reference numeral 115 denotes an illumination unit (an electronic flash for illuminating an object). A flash illumination device using a xenon tube is suitably used as an illumination unit 115. Instead of this, an illumination unit including an LED which continuously emits light may also be used.

Reference numeral 121 denotes a CPU (a signal processor). The CPU 121 is a camera CPU which governs various kinds of controls in the camera body, and includes a calculation portion, a ROM, a RAM, an A/D converter, a D/A converter, a communication interface circuit, and the like. The CPU 121 drives each kind of circuits included in the camera 200 based on a predetermined program stored in the ROM to perform a series of operations such as AF, imaging, image processing, and recording.

Further, the CPU 121 includes a focus detector, a selector, and a calculator. The focus detector is configured so as to perform focus detection of the imaging lens 100, and obtains first and second pairs of image signals having optical base lengths different from each other from the image pickup element 107. The selector selects one of the first and second pairs of image signals based on at least one correlation amount of the first and second pairs of image signals obtained by the focus detector. The calculator calculates a defocus amount based on the pair of image signals selected by the selector. The details of the focus detector, the selector, and the calculator will be described below. Each function of them is included in the CPU 121 as a signal processor which is integrated in one chip. However, a plurality of signal processors may also be combined so as to include these functions.

Reference numeral 122 denotes an electronic flash control circuit. The electronic flash control circuit 122 controls the lighting of the illumination unit 115 in synchronization with an imaging operation. Reference numeral 124 denotes an image pickup element driving circuit. The image pickup element driving circuit 124 controls the imaging operation of the image pickup element 107, and also performs an A/D conversion of the obtained image signal to transmit it to the CPU 121. Reference numeral 125 denotes an image processing circuit. The image processing circuit 125 performs each of processes such as a γ conversion, a color interpolation, and a JPEG compression for an image obtained by the image pickup element 107.

Reference numeral 126 denotes a focus driving circuit. The focus driving circuit 126 performs a drive control of the focus actuator 114 based on a focus detection result, and performs a drive of the third lens group 105 backward and forward in the optical axis direction to perform a focus adjustment. Reference numeral 128 denotes an aperture and shutter driving circuit. The aperture and shutter driving circuit 128 performs a drive control of the aperture and shutter actuator 112 to control the opening of the shutter with an aperture 102. Reference numeral 129 denotes a zoom driving circuit. The zoom driving circuit 129 drives the zoom actuator 111 in accordance with a zoom operation by a user.

Reference numeral 131 denotes a display such as an LCD. The display 131 displays information of an imaging mode of the camera 200, a preview image before imaging and a confirmation view after the imaging, an in-focus state display image at the time of focus detection, or the like. Reference numeral 132 denotes an operation switch. The operation switch 132 is constituted by an operation switch group such as a power supply switch, a release (an imaging trigger) switch, a zoom operation switch, and an imaging mode selection switch. Reference numeral 133 denotes a detachable flash memory. The flash memory 133 records an image which has been imaged.

Figure 2:
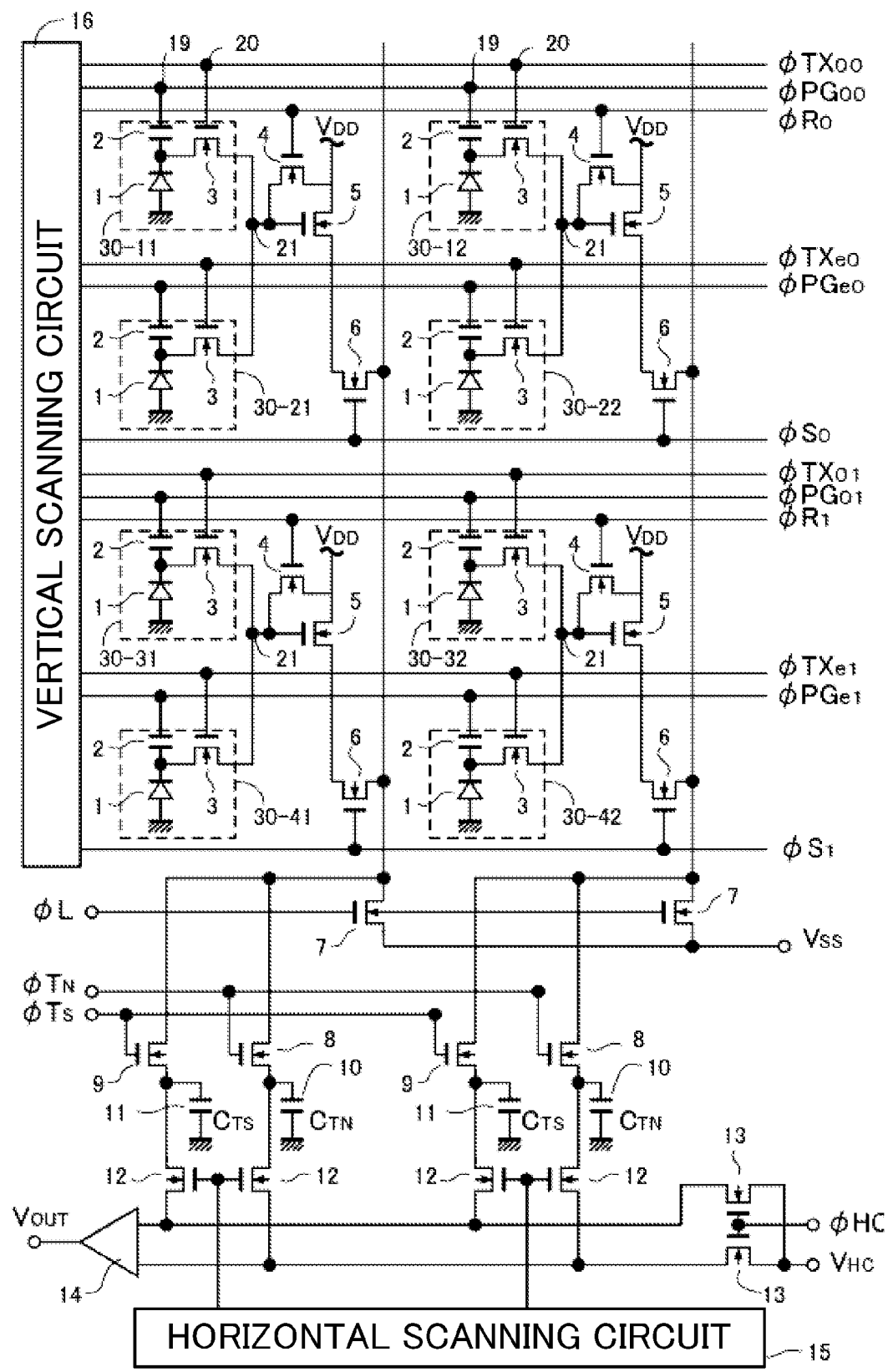
FIG. 2 is a circuit configuration diagram of an image pickup element in the present embodiment.

FIG. 2 is a schematic circuit configuration diagram of the image pickup element 107 in the present embodiment. As an image pickup element 107, for example a configuration disclosed in Japanese Patent Laid-open No. 09-046596 filed by the applicant is suitably used. The circuit configuration shown in FIG. 2 shows a range of a photoelectric converter of 2×4 (two columns and four rows) of a two-dimensional CMOS area sensor (image pickup element 107), and is a circuit configuration including eight pixels.

In FIG. 2, reference numeral 1 denotes a photoelectric converter of the photoelectric conversion element including a MOS transistor gate and a depletion layer under the gate. Reference numeral 2 denotes a photo gate, reference numeral 3 denotes a transfer switch MOS transistor, reference numeral 4 denotes a reset MOS transistor, reference numeral 5 denotes a source-follower amplifying MOS transistor, and reference numeral 6 denotes a horizontal select switch MOS transistor. Reference numeral 7 denotes a source-follower load MOS transistor, reference numeral 8 denotes a dark output transfer MOS transistor, reference numeral 9 denotes a light output transfer MOS transistor, reference numeral 10 denotes a dark output storage capacitor CTN, and reference numeral 11 denotes a light output storage capacitor CTS. Reference numeral 12 denotes a horizontal transfer MOS transistor, reference numeral 13 denotes a horizontal output line reset MOS transistor, reference numeral 14 denotes a differential output amplifier, reference numeral 15 denotes a horizontal scanning circuit, and reference numeral 16 denotes a vertical scanning circuit.

Figure 3:
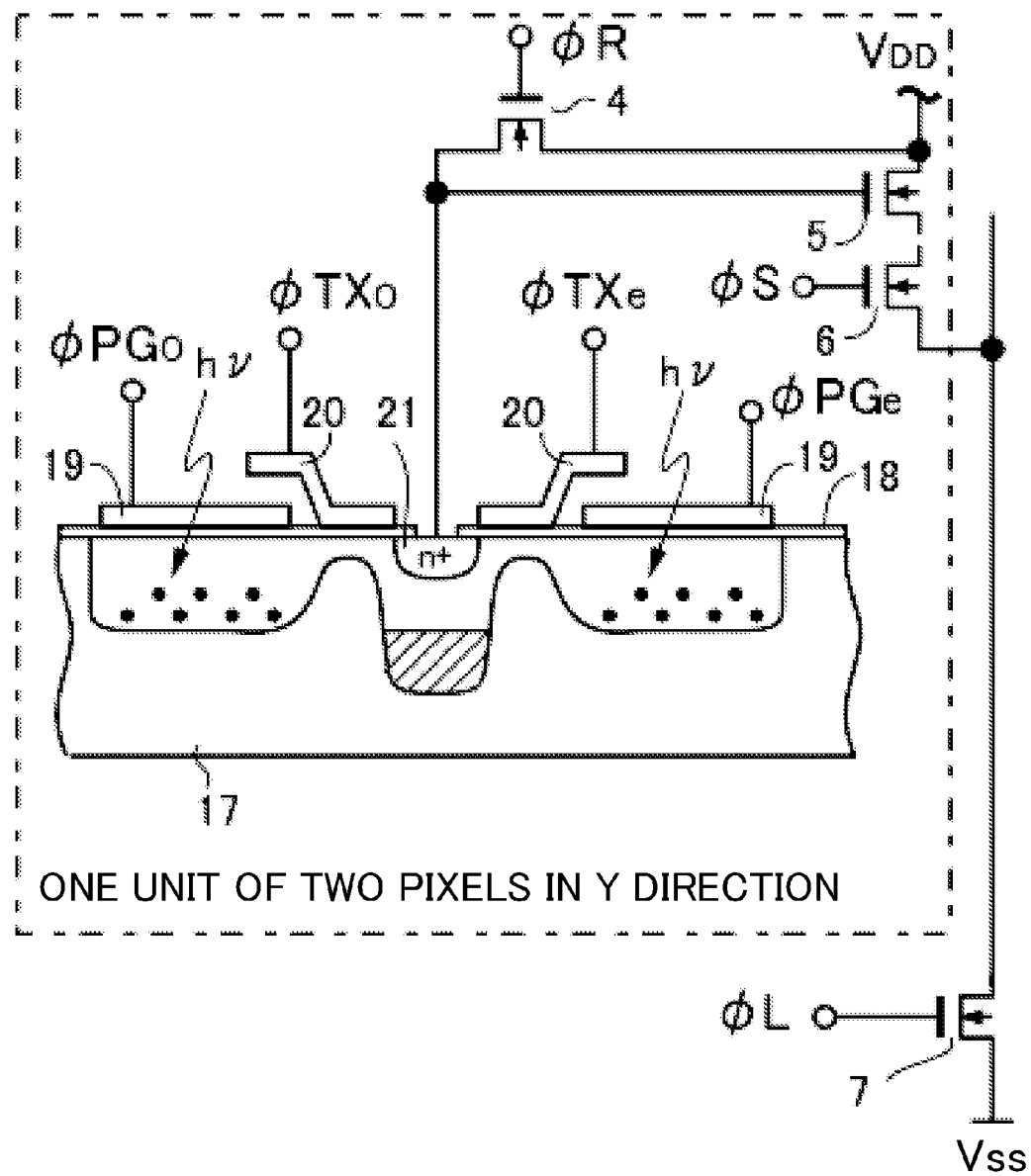
FIG. 3 is a cross-sectional view of a pixel wiring part of an image pickup element in the present embodiment.

FIG. 3 is a cross-sectional view of a pixel wiring part in the image pickup element 107.

In FIG. 3, reference numeral 17 denotes a P-type well, reference numeral 18 denotes a gate oxide film, reference numeral 19 denotes a first layer poly-Si, reference numeral 20 denotes a second layer poly-Si, and reference numeral 21 denotes an FD part (n+ floating diffusion part). The FD part 21 is connected with another photoelectric converter via another transfer MOS transistor. In FIG. 2, drains of two transfer MOS transistors 3 and the FD part 21 are shared to be miniaturized and improve sensitivity due to the capacitance reduction. Instead of this, the FD part 21 may also be connected with an Al wire.

Figure 4:
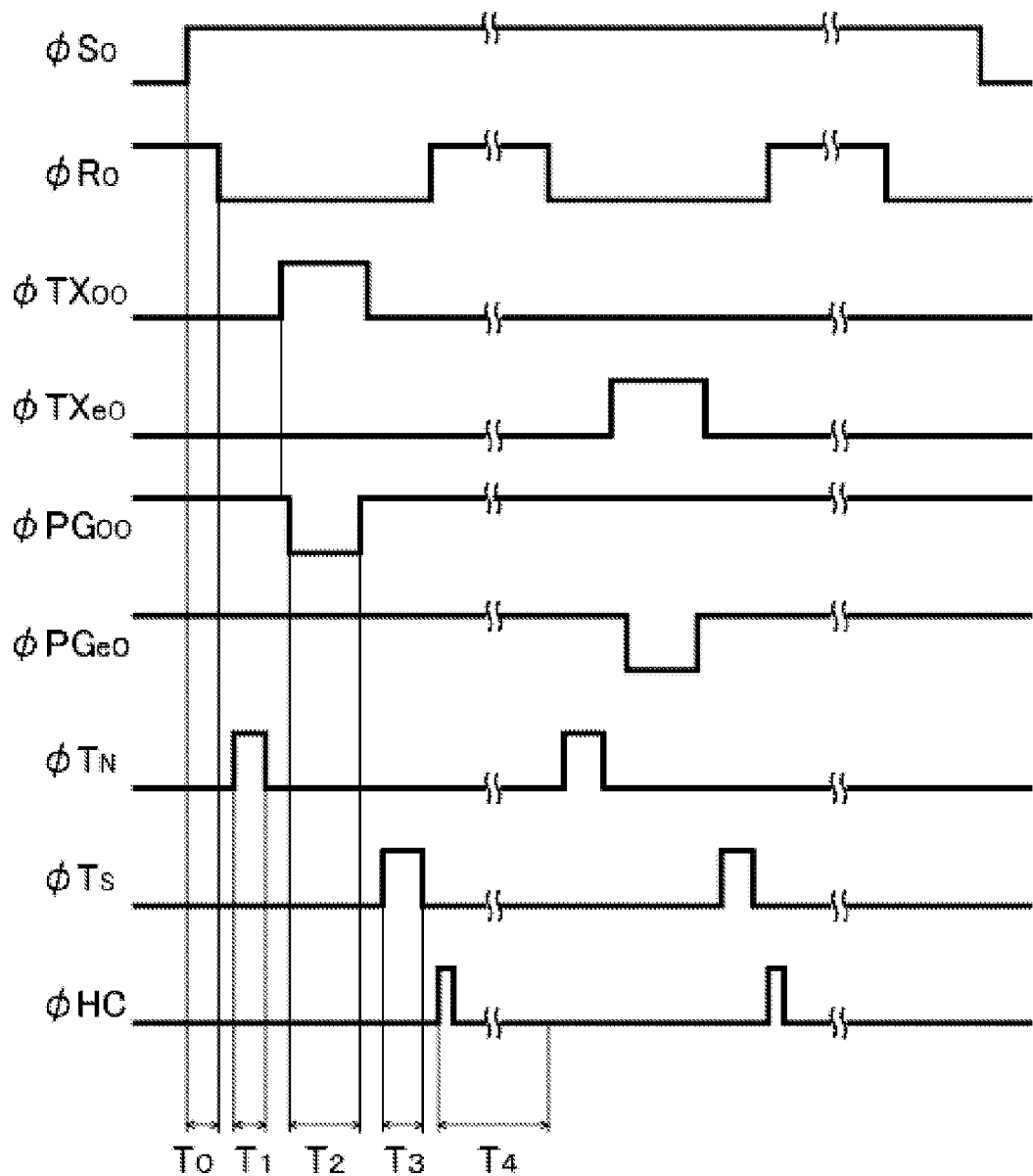
FIG. 4 is a timing chart of an operation of an image pickup element in the present embodiment.

Next, the operation of the image pickup element 107 will be described with reference to a timing chart of FIG. 4. The timing chart shown in FIG. 4 is obtained in a case where all pixels independently output corresponding signals.

First, due to a timing output from the vertical scanning circuit 16, a control pulse φL in FIG. 2 is changed to be "high" to reset a vertical output line. In addition, control pulses φR0, φPG00, and φPGe0 are changed to "high", the reset MOS transistor 4 is turned on, and the first layer poly-Si 19 of the photo gate 2 is changed to "high".

At time T0, a control pulse φS0 is changed to "high" and the select switch MOS transistor 6 is turned on to select pixel parts of the first and second lines. Next, the control pulse φRO is changed to "low" to stop resetting the FD part 21 so that the FD part 21 is in a floating state. After a path between a gate and a source of the source-follower amplification MOS transistor 5 is changed to be conductive, a control pulse φTN is changed to "high" at time T1 to output a dark voltage of the FD part 21 to the storage capacitor CTN 10 by a source-follower operation.

Next, in order to perform a photoelectric conversion output of a pixel of the first line, a control pulse φTX00 of the first line is changed to "high" to make the transfer MOS transistor 3 conductive. Subsequently, the control pulse φPG00 is changed to "low" at time T2. At this time, it is preferable that a potential well extending under the photo gate 2 is elevated to be set to a voltage relation in which light generating carriers are fully transferred to the FD part 21. Therefore, if the full transfer is possible, the control pulse φTX may also be a fixed electric potential instead of a pulse.

When charges from the photoelectric converter 1 of a photodiode is transferred to the FD part 21 at time T2, the electric potential of the FD part 21 changes depending on the light. At this time, because the source-follower amplification MOS transistor 5 is in a floating state, a control pulse φTs is changed to "high" at time T3 to output the electric potential of the FD part 21 to the storage capacitor CTS11. At this point, the dark output and the light output of the pixel of the first line are stored in the storage capacitor CTN10 and the storage capacitor CTS11, respectively. A control pulse φHC at time T4 is changed to "high" for a short time to make the horizontal output line reset MOS transistor 13 conductive to reset the horizontal output line. Then, during a horizontal transfer period of time, the dark output and the light output of the pixel are outputted to the horizontal output line based on a scanning timing signal of the horizontal scanning circuit 15.

In this case, a signal having a good S/N from which a random noise and a fixed pattern noise have been removed can be obtained by using a differential output VOUT outputted from the differential amplifier 14 of the storage capacitor CTN10 and the storage capacitor CTS11. Light charges of pixels 30-12 and 30-22 are stored in respective storage capacitors CTN10 and CTS11 at the same time as the pixels 30-11 and 30-21. These light charges are read out to the horizontal output line by delaying a timing pulse from the horizontal scanning circuit 15 by one pixel to be outputted from the differential amplifier 14.

In the present embodiment, the configuration where the differential output VOUT is performed inside a chip is shown. However, the similar effect can also be obtained in a case where the differential output VOUT is configured so as to be performed by an external component without being included in the chip and a conventional CDS (Correlated Double Sampling) circuit is used.

After the light output is outputted to the storage capacitor CTS11, the control pulse φR0 is changed to "high" to make the reset MOS transistor 4 conductive to reset the FD part 21 to a power source VDD. After the horizontal transfer of the first line is finished, a signal on the second line is read out. The signal on the second line is read out by driving control pulses φTXe0 and φPGe0 similarly to supply high pulses to each of control pulses φTN and φTS. Then, the light charges are stored in each of the storage capacitors CTN10 and CTS11 to retrieve the dark output and the light output.

Due to the drive described above, each signal on the first and the second lines can be independently read out. Then, the vertical scanning circuit performs a scanning to read out 2n+1 and 2n+2 (n=1, 2, . . . ) lines similarly and therefore signals of all pixels can be independently outputted. In other words, when n is equal to 1, at first a control pulse φS1 is changed to "high" and next a control pulse φR1 is changed to "low", and subsequently control pulses φTN and φTX01 are changed to "high". Then, control pulses φPG01 and φTS are changed to "low" and "high" respectively, and a control pulse φHC is changed to "high" for a short time to read out pixel signals of pixels 30-31 and 30-32. Subsequently, control pulses φTXe1 and φPGe1 and the control pulses as described above are applied to read out pixel signals of pixels 30-41 and 30-42.

Figure 5:
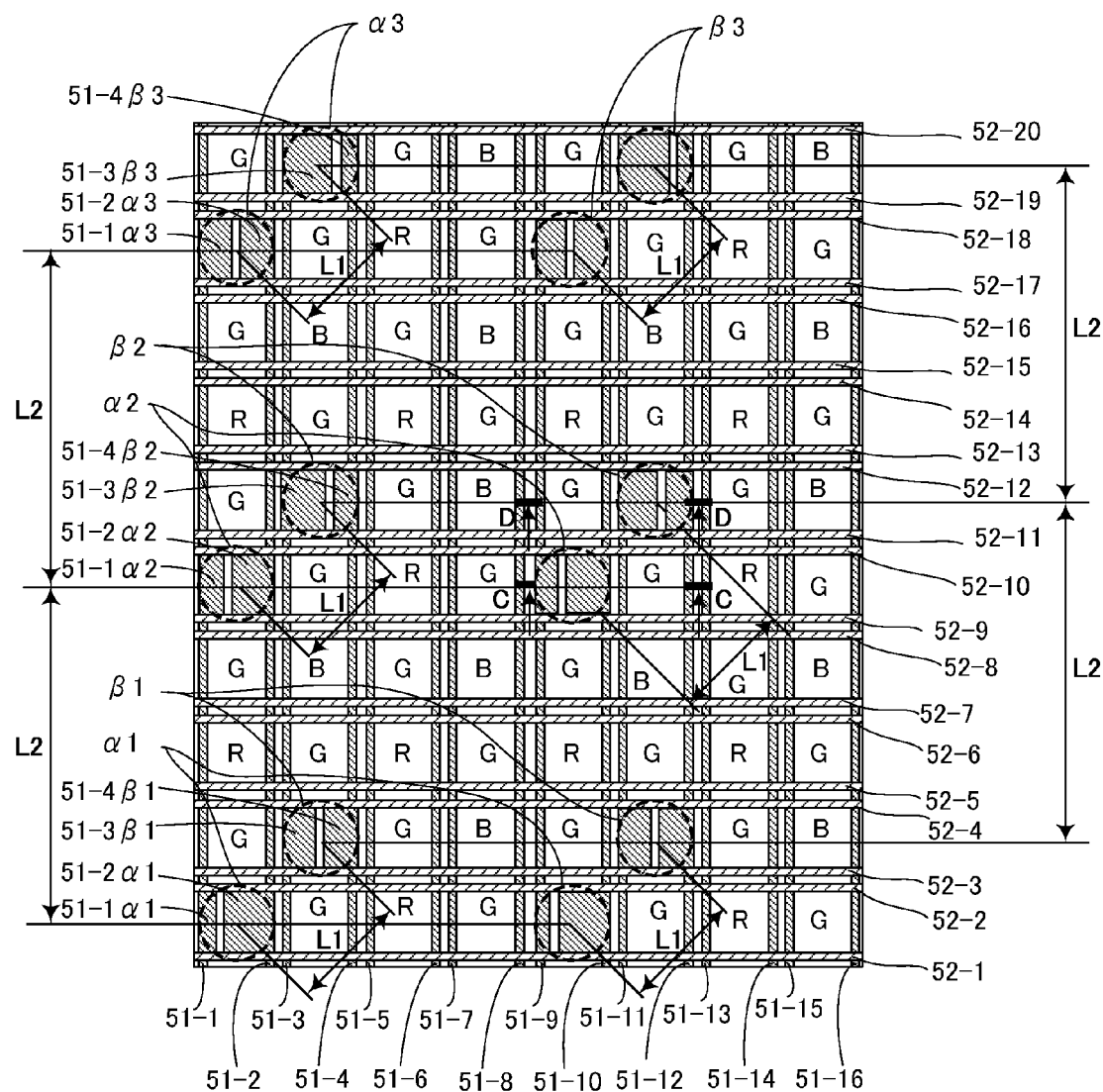
FIG. 5 is a plan view showing a part of an image pickup element in the present embodiment.

FIG. 5 is a plan view showing a part of a CMOS sensor that is one example as an image pickup element 107.

In FIG. 5, reference numerals 51 and 52 denote electrodes. A region separated by the electrodes 51 and 52 indicates one pixel. Letters of "R", "G", and "B" written in one pixel represent color phases of a color filter in each pixel. Light that has a red component transmits through the pixel where the letter "R" is written. Light that has a green component transmits through the pixel where the letter "G" is written. Light that has a blue component transmits through the pixel where the letter "B" is written. Each pixel where the letters of "R", "G", and "B" are written is configured so as to receive the light in all pupil regions of the imaging lens 100.

When an array of the color filter is a Bayer array, one picture element is made of pixels "R" and "B" and two pixels "G". A focus detection pixel which receives light in a pupil region of a part of the imaging lens 100 is allocated to a part of pixels that should have been the pixel "R" or "B" in the image pickup element 107 in the optical device of the present embodiment. In FIG. 5, α1, β1, α2, β2, α3, and β3 are focus detection pixels for performing focus detections of the imaging lens 100. Openings of these pixels in a horizontal direction are limited by the electrode 51.

In the focus detection pixels which are arranged at a part of the image pickup element 107 of the present embodiment, opening center positions in the horizontal direction of the openings which are limited by the electrode 51 (centers of gravity of light receiving sensitivity) are different from one another with respect to a pixel center. In the present embodiment, five kinds of focus detection pixels having opening center positions different from one another are arranged.

For example, focus detection pixels having the similar electrode opening are arranged at positions at a remove of four pixels in a horizontal direction with respect to focus detection pixels α1 where openings determined by electrodes 51-1-α1 and 51-2-α1 are displaced in a right-to-left horizontal direction with respect to a pixel center.

At positions obliquely adjacent to the respective focus detection pixels α1, focus detection pixels β1 are arranged so that openings determined by electrodes 51-3-β1 and 51-4-β1 are substantially coincident with the pixel center. Further, focus detection pixels having the similar electrode openings are arranged at positions at a remove of four pixels in the horizontal direction with respect to the respective focus detection pixels β1.

Figure 6A:
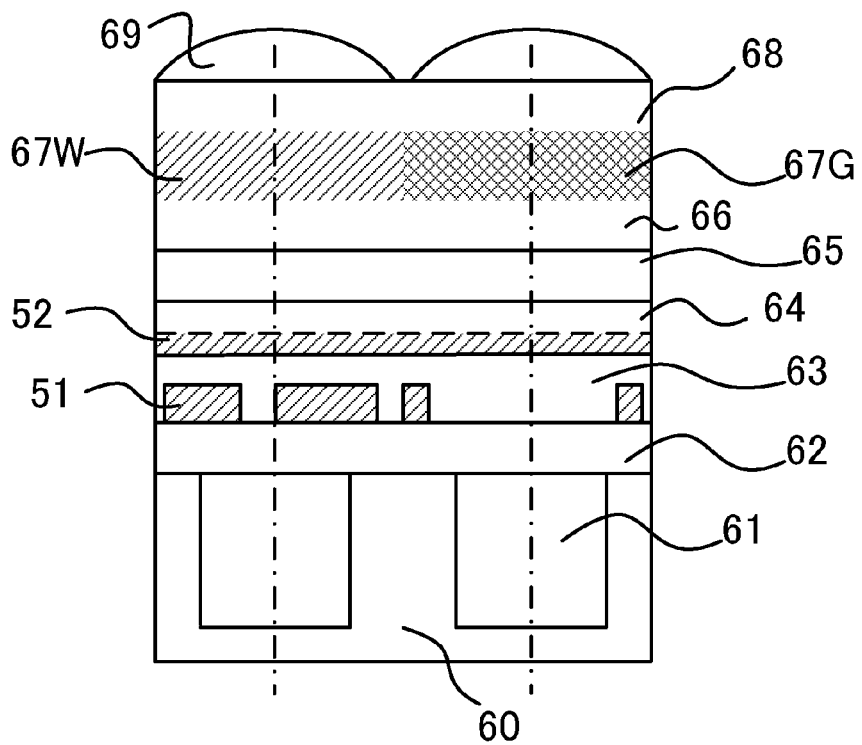
FIGS. 6A and 6B are cross-sectional views of a pixel of an image pickup element in the present embodiment.
Figure 6B:
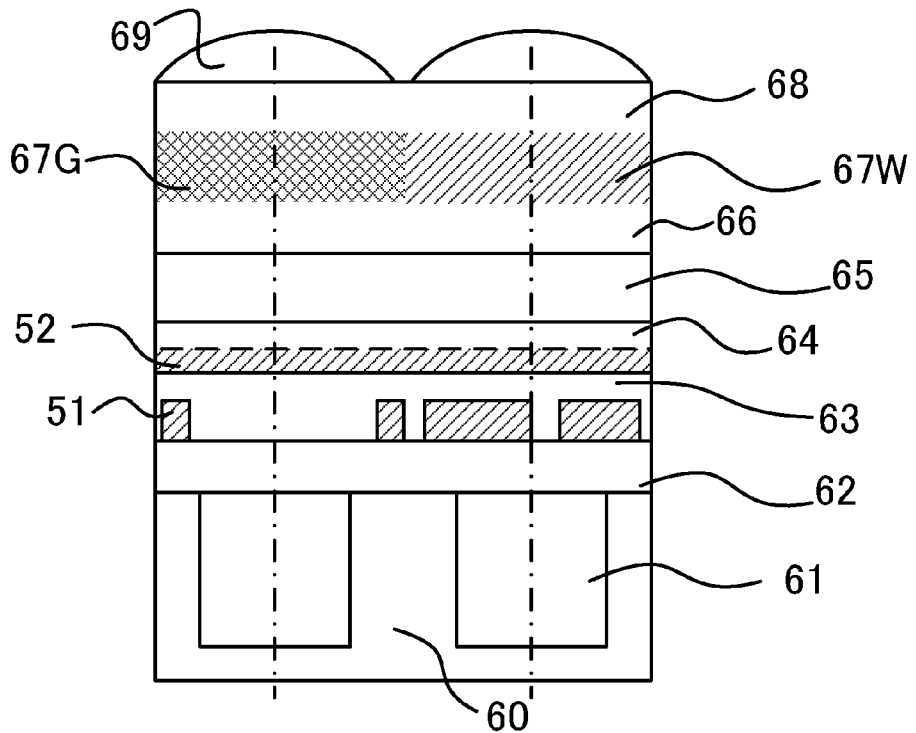

FIGS. 6A and 6B are cross-sectional views of focus detection pixels α2 and β2 and adjacent pixels of the image pickup element 107 in FIG. 5. FIGS. 6A and 6B are C-C and D-D cross-sectional views in FIG. 5, respectively.

The pixel at the left side of FIG. 6A indicates a focus detection pixel α2, and the pixel at the right side indicates a pixel capable of receiving light in all pupil regions of the imaging lens 100.

The image pickup element 107 includes a photoelectric converter 61 which is formed in a silicon substrate 60. A signal charge generated in the photoelectric converter 61 is outputted outside via a floating diffusion part, a first electrode 51, and a second electrode 52. Actually, the electrode 52 does not exist on the cross-sectional view at a center of the photoelectric converter 61, but exists in a depth direction. In the drawings, the position of the electrode 52 in a height direction is indicated by a dashed line.

An interlayer insulating film 62 is formed between the photoelectric converter 61 and the electrode 51, and an interlayer insulating film 63 is formed between the electrode 51 and the electrode 52. At the incident side of the electrode 52, an interlayer insulating film 64 is formed and also a passivation film 65 and a planarization layer 66 are formed.

At the light incident side of the planarization layer 66 of the cross section, a color filter layer 67, a planarization layer 68, and a micro lens 69 are formed. The power of the micro lens 69 is set so the pupil of the imaging lens 100 is substantially conjugate with the photoelectric converter 61. The micro lens 69 is arranged at a pixel center for a pixel positioned at a center of the image pickup element 107, and is arranged displaced at an optical axis side of the imaging lens 100 for a pixel positioned at its periphery.

Object light transmitted through the imaging lens 100 is condensed near the image pickup element 107. Further, the light that reaches each pixel of the image pickup element 107 is refracted by the micro lens 69 to be condensed on the photoelectric converter 61. In a pixel at the right side in FIG. 6A, which is used for a normal imaging, the first electrode 51 and the second electrode 52 are arranged so as not to shield the incident light.

On the other hand, a pixel which is used for performing the focus detection of the imaging lens 100 at the left side in FIG. 6A is configured so that a part of the electrode 51 covers the photoelectric converter 61. As a result, the focus detection pixel at the left side in FIG. 6A is configured so that the light beam transmitted through a part of the imaging lens 100 is capable of being received. Further, in order to prevent the output of the photoelectric converter 61 from being lower because the electrode 51 shields a part of the incident light beam, a color filter layer 67W of the focus detection pixel is formed by a resin which is resistant to absorb the light and has a high transmittance.

Similarly, the pixel at the right side in FIG. 6B indicates the focus detection pixel $\beta 2$ and the pixel at the left side indicates a pixel capable of receiving the light in all pupil regions of the imaging lens 100. As shown in FIGS. 6A and 6B, the focus detection pixels $\alpha 2$ and $\beta 2$ have shapes substantially bilaterally symmetric to each other. These pixels are configured so as to have light receiving distributions of the imaging lens 100 different from each other by making a position of the micro lens 69 and a relative position of the opening center of the electrode 51 different.

The focus detector of the present embodiment obtains a first pair of image signals from the focus detection pixel $\alpha 1$ (a focus detection pixel group which has the similar electrode opening) and the focus detection pixel $\beta 1$ (a focus detection pixel group which has the similar electrode opening). Similarly, with regard to the combinations of the focus detection pixels $\alpha 2$ and $\beta 2$ and the focus detection pixels $\alpha 3$ and $\beta 3$, the focus detector obtains the respective pair of image signals. The focus detector uses the pair of image signals obtained from these pixels to average a focus state of the imaging lens 100.

The focus detector also obtains a second pair of image signals from the focus detection pixel $\alpha 1$ (a focus detection pixel group which has the similar electrode opening) and the focus detection pixel $\alpha 2$ (a focus detection pixel group which has the similar electrode opening). In this regard, this is true for the combinations of the focus detection pixels $\alpha 2$ and $\alpha 3$, the focus detection pixels $\beta 1$ and $\beta 2$, and the focus detection pixels $\beta 2$ and $\beta 3$. The focus detector uses the pair of image signals obtained from these pixels to average the focus state of the imaging lens 100.

In this case, an optical base length of the second pair of image signals is shorter than that of the first pair of image signals.

As shown in FIG. 5, in the image pickup element 107 of the present embodiment, all the three pairs of focus detection pixels (focus detection pixel groups $\alpha 1$-$\beta 1$, $\alpha 2$-$\beta 2$, and $\alpha 3$-$\beta 3$) are arranged at a remove of a diagonal length of a pixel pitch from each other (distance L1). In other words, when the focus detection pixels $\alpha 1$ and $\beta 1$ are defined as a first focus detection pixel and a second focus detection pixel respectively, the distance between the first and second focus detection pixels is L1.

On the other hand, all the four pairs of focus detection pixels (focus detection pixel group $\alpha 1$-$\alpha 2$, $\alpha 2$-$\alpha 3$, $\beta 1$-$\beta 2$, and $\beta 2$-$\beta 3$) are arranged at a remove of four pixel pitches from each other (distance L2). In other words, when the focus detection pixels $\alpha 1$ and $\alpha 2$ are defined as a first focus detection pixel and a third focus detection pixel respectively, the distance between the first and third focus detection pixels is L2.

Thus, the distance L2 between the first and third focus detection pixels is larger than the distance L1 between the first and second focus detection pixels.

As shown in FIG. 5, the center of gravity of the light sensitivity in the first, second, and third focus detection pixels are displaced from one another. The second and third focus detection pixels are arranged in a direction different from a displacement direction of the center of gravity of the light sensitivity with respect to the first focus detection pixel.

At the time of taking a normal image, the focus detection pixel where the electrode opening of the pixel is limited is treated as a defect pixel. Therefore, an image signal is generated by performing an interpolation process using a pixel positioned around the focus detection pixel.

FIGS. 7A to 7F are light sensitivity characteristics on a pupil plane at a remove of a predetermined distance (100 mm) from a focus detection pixel arranged at a part of the image pickup element 107.

Figure 7A:
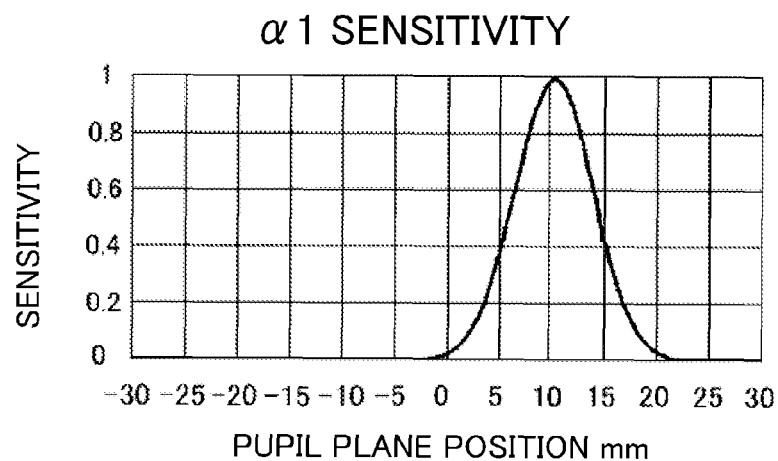
FIGS. 7A to 7F are light sensitivity characteristics on a pupil plane at a remove of a predetermined distance from a focus detection pixel in the present embodiment.

FIG. 7A shows a light sensitivity characteristic on the pupil plane at a remove of a predetermined distance (100 mm) from the focus detection pixel $\alpha 1$ of the image pickup element 107. The center of the opening determined by the electrodes 51-1 and 51-2 of the focus detection pixel $\alpha 1$ is significantly displaced in a right-to-left horizontal direction (−) with respect to the center of the pixel. In other words, the center of gravity of the light sensitivity is displaced. Therefore, the center of the region capable of receiving light in the photoelectric converter of the focus detection pixel $\alpha 1$ is displaced by the distance of around +10 mm with respect to the optical axis on the pupil plane.

Figure 7B:
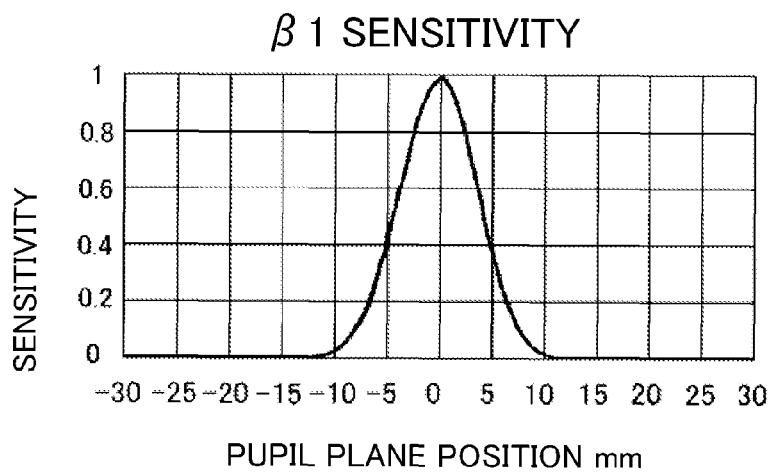

FIG. 7B shows a light sensitivity characteristic on the pupil plane at a remove of a predetermined distance (100 mm) from the focus detection pixel $\beta 1$. The center of the opening determined by the electrodes 51-3 and 51-4 of the focus detection pixel $\beta 1$ is substantially coincident with the center of the pixel. Therefore, the center of the region capable of receiving light in the photoelectric converter of the focus detection pixel $\beta 1$ is substantially coincident with the optical axis on the pupil plane.

Figure 7C:
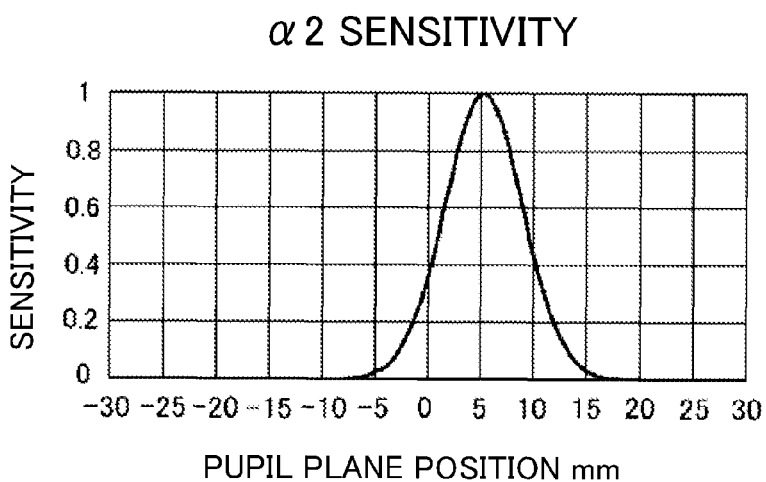

FIG. 7C shows a light receiving distribution on the pupil plane at a remove of a predetermined distance (100 mm) from the focus detection pixel $\alpha 2$. The center of the opening determined by the electrodes 51-1 and 51-2 of the focus detection pixel $\alpha 2$ is displaced in a right-to-left horizontal direction (−) with respect to the center of the pixel. Therefore, the center of the region capable of receiving light in the photoelectric converter of the focus detection pixel $\alpha 2$ is displaced by the distance of around +5 mm with respect to the optical axis on the pupil plane.

Figure 7D:
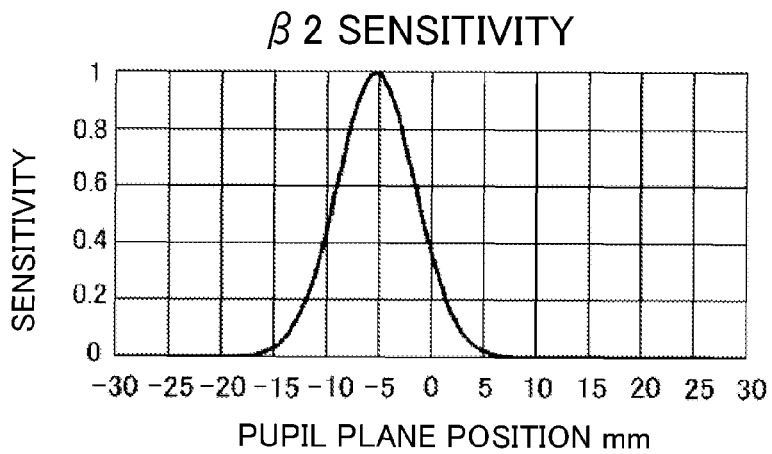

FIG. 7D shows a light receiving distribution on the pupil plane at a remove of a predetermined distance (100 mm) from the focus detection pixel $\beta 2$. The center of the opening determined by the electrodes 51-3 and 51-4 of the focus detection pixel β2 is displaced in a left-to-right right horizontal direction (+) with respect to the center of the pixel. Therefore, the center of the region capable of receiving light in the photoelectric converter of the focus detection pixel β2 is displaced by the distance of around −5 mm with respect to the optical axis on the pupil plane.

Figure 7E:
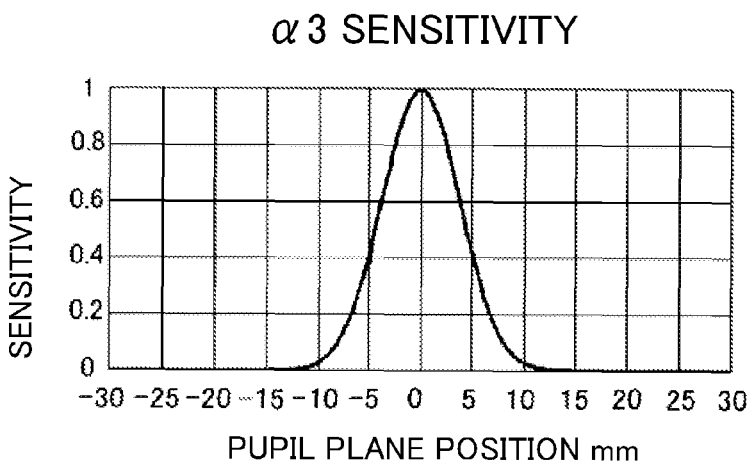

FIG. 7E shows a light receiving distribution on the pupil plane at a remove of a predetermined distance (100 mm) from the focus detection pixel α3. The center of the opening determined by the electrodes 51-1 and 51-2 of the focus detection pixel α3 is substantially coincident with the center of the pixel. Therefore, the center of the region capable of receiving light in the photoelectric converter of the focus detection pixel α3 is substantially coincident with the optical axis on the pupil plane. The light receiving distribution on the pupil plane of the focus detection pixel α3 is substantially coincident with that on the pupil plane of the focus detection pixel β1.

Figure 7F:
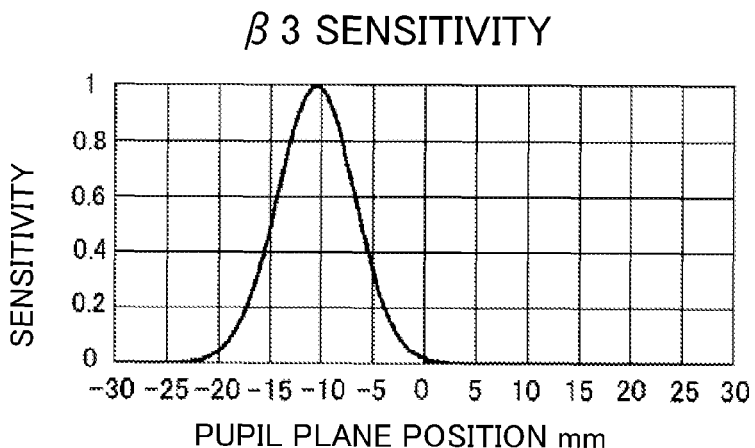

FIG. 7F shows a light receiving distribution on the pupil plane at a remove of a predetermined distance (100 mm) from the focus detection pixel β3. The center of the opening determined by the electrodes 51-3 and 51-4 of the focus detection pixel β3 is significantly displaced in a left-to-right horizontal direction (+) with respect to the center of the pixel. Therefore, the center of the region capable of receiving light in the photoelectric converter of the focus detection pixel β3 is displaced by the distance of around −10 mm with respect to the optical axis on the pupil plane.

As above, the focus detection pixel of the image pickup element 107 in the present embodiment is made of five kinds of pixel groups which exist at positions where the centers of the light receiving distribution are different from one another.

Figure 8A:
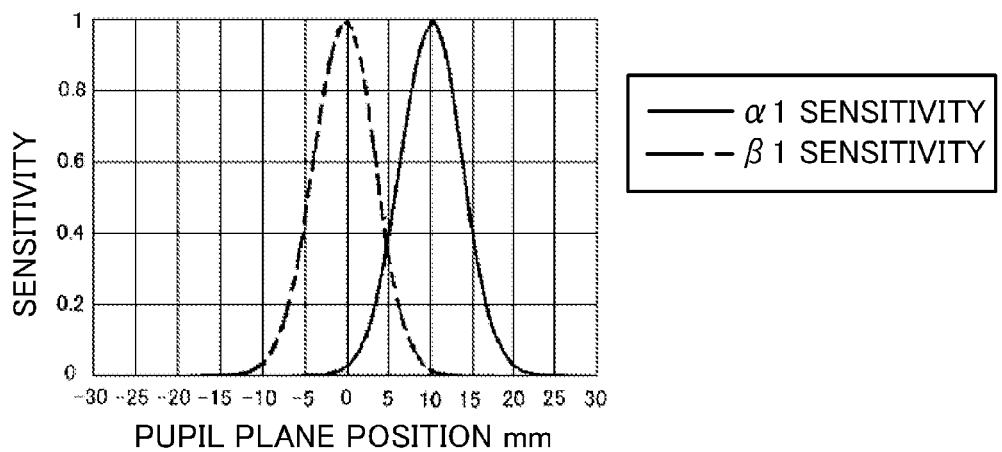
FIGS. 8A to 8C are light sensitivity characteristics of a pair of focus detection pixels having a long optical base length.
Figure 8B:
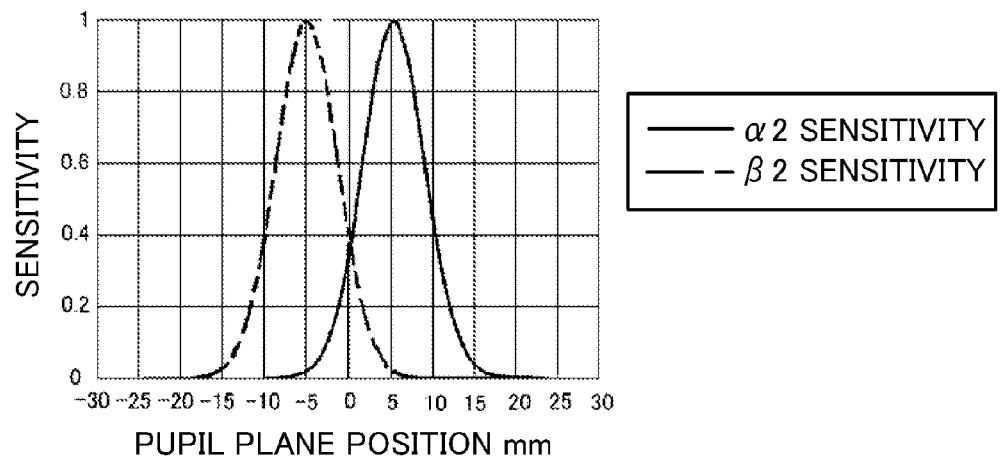
Figure 8C:
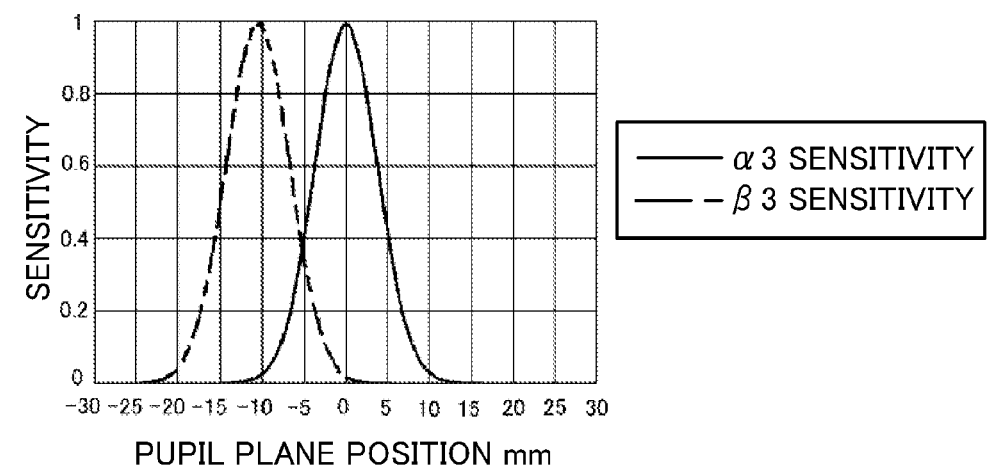

FIGS. 8A to 8C are light sensitivity characteristics of a pair of focus detection pixels whose optical base length are long.

FIG. 8A is a light sensitivity characteristic of a focus detection pixel group represented by the focus detection pixels α1 and β1 on the pupil plane at a remove of a predetermined distance (100 mm) from the image pickup element 107. A displacement of positions of two light sensitivity peak corresponds to the optical base length, and the optical base length in this case is around 10 mm.

Similarly, FIGS. 8B and 8C are light sensitivity characteristics of the focus detection pixel groups represented by the focus detection pixels α2 and β2 and the focus detection pixels α3 and β3, respectively. The optical base lengths in both cases are around 10 mm.

FIGS. 9A to 9D are light sensitivity characteristics of a pair of focus detection pixels whose optical base length are short.

Figure 9A:
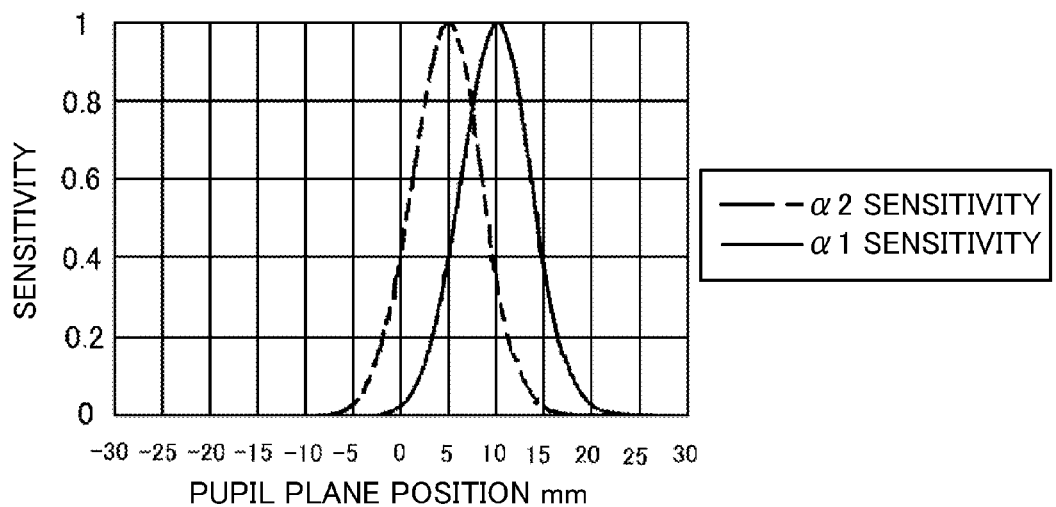
FIGS. 9A to 9D are light sensitivity characteristics of a pair of focus detection pixels having a short optical base length.

FIG. 9A is a light sensitivity characteristic of a focus detection pixel group represented by the focus detection pixels α1 and β2 on the pupil plane at a remove of a predetermined distance (100 mm) from the image pickup element 107. A displacement of positions of two light sensitivity peak corresponds to the optical base length, and the optical base length in this case is around 5 mm.

Figure 9B:
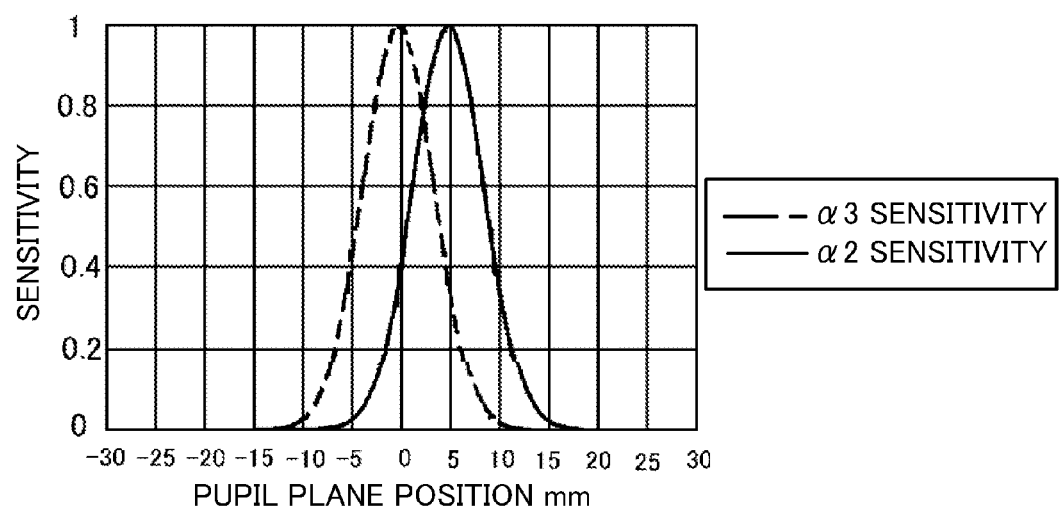
Figure 9C:
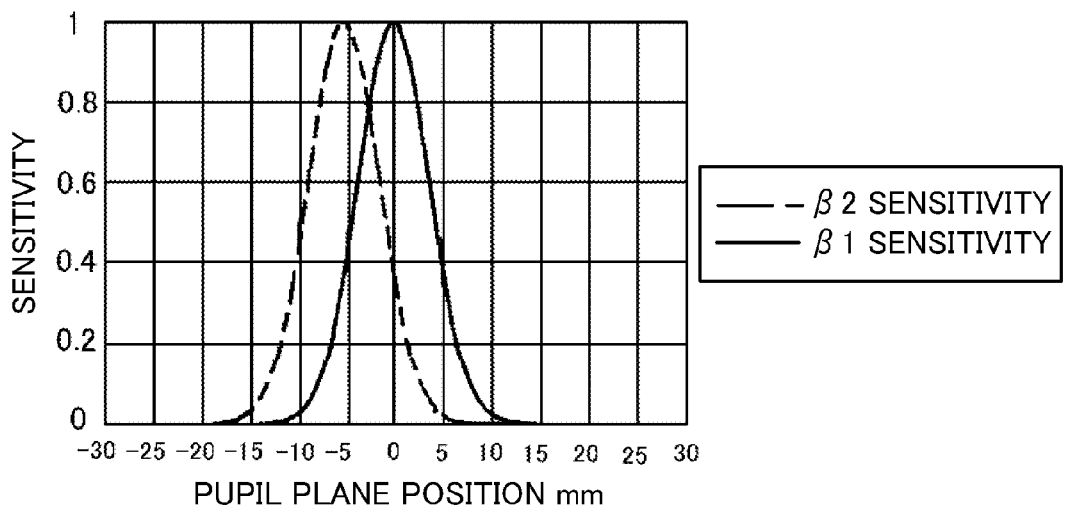
Figure 9D:
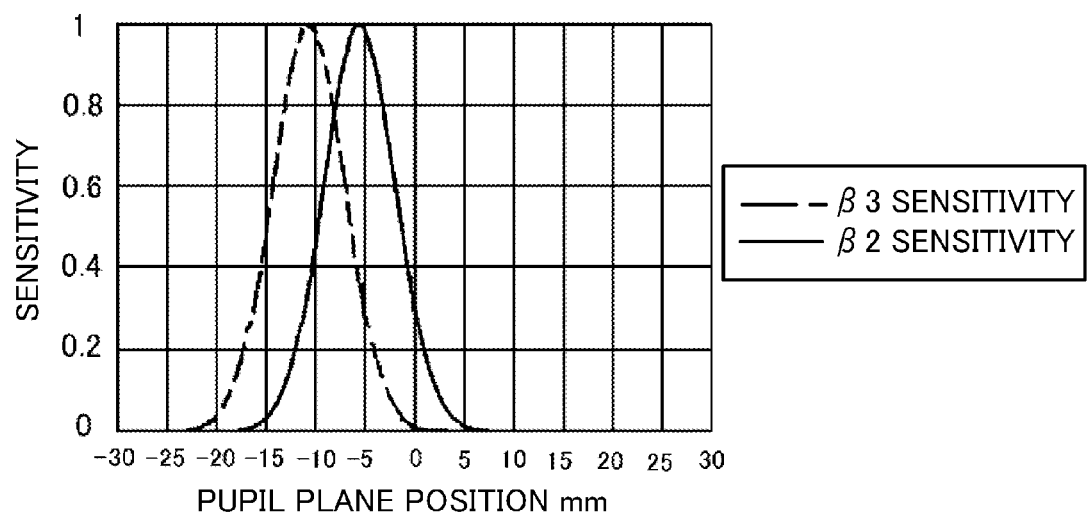

Similarly, FIGS. 9B to 9D are light sensitivity characteristics of the focus detection pixel groups represented by the focus detection pixels α2 and α3, the focus detection pixels β1 and β2, and the focus detection pixels β2 and β3, respectively. The optical base lengths in any cases are around 5 mm.

Thus, the optical base lengths of the focus detection pixel groups of FIGS. 9A to 9D (combinations of the focus detection pixels at a remove of four pixel pitches (L2) from each other) are shorter than those of the focus detection pixel groups of FIG. 8 (combinations of the focus detection pixels at a remove of a diagonal length of a pixel pitch (L1)).

Figure 10A:
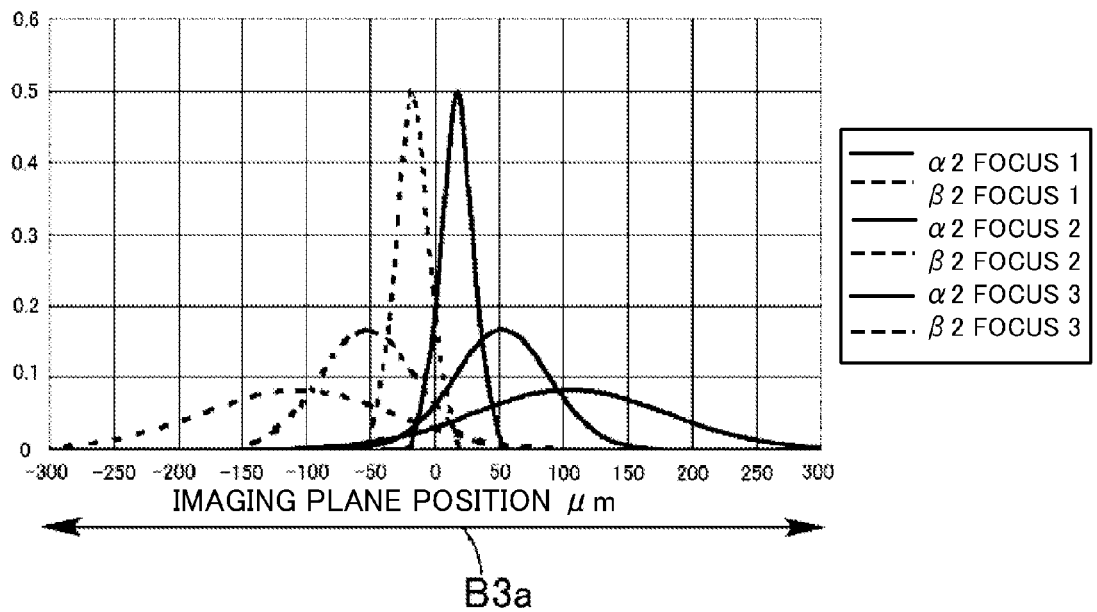
FIGS. 10A and 10B are explanatory diagrams of a blur of line image obtained by a pair of focus detection pixels in the present embodiment.
Figure 10B:
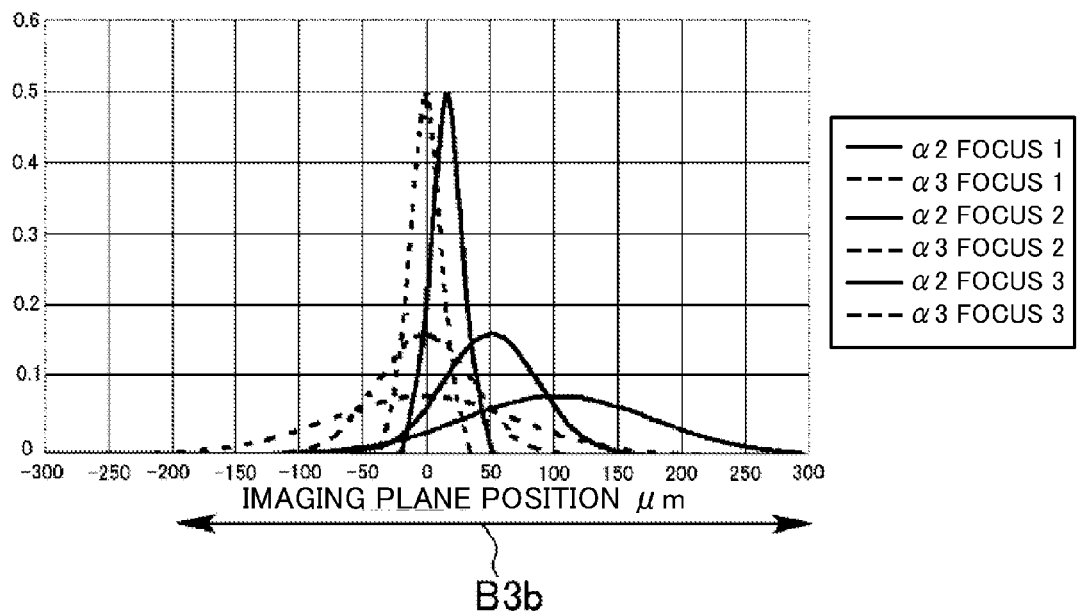

Next, referring to FIGS. 10A and 10B, a blur of a line image caused by focus detection pixels having optical base lengths different from each other will be described. FIGS. 10A and 10B are explanatory diagrams of a blur of a line image obtained by a pair of focus detection pixel groups.

FIG. 10A shows a state of a blur of the line image in a combination of the focus detection pixels α2 and β2 with respect to a rear focus side as a representative of focus detection pixel group whose optical base length is long (A image). FIG. 10B shows a state of a blur of the line image in a combination of the focus detection pixels α2 and α3 with respect to the rear focus side as a representative of focus detection pixel group whose optical base length is short (B image).

When an image is in focus, images having similar shapes like an impulse shape for both of the A and B images are obtained. In FIGS. 10A and 10B, focuses 1, 2, and 3 indicates situations of the A and B images of the case where the image is gradually out of focus.

As shown in FIG. 10A, when the base length is long, a focus detection pixel in a range of the maximum length of B3a is necessary in a state of focus 3. On the other hand, as shown in FIG. 10B, when the base length is short, a focus detection pixel has the maximum length B3b (B3a>B3b) in the state of focus 3. Thus, when the base length is short, the number of necessary focus detection pixels is small as compared with the case where the base length is long.

Figure 11A:
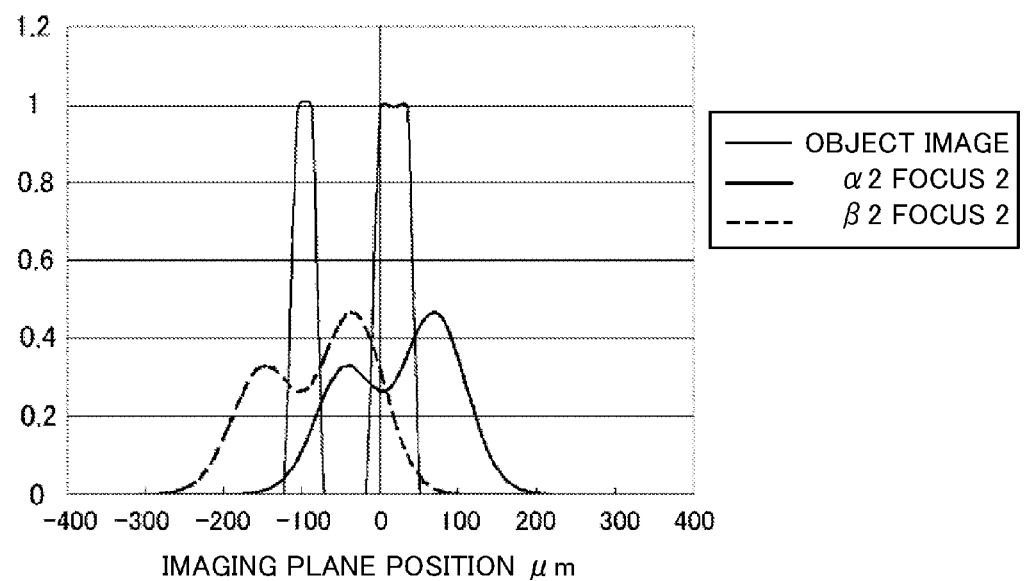
FIGS. 11a and 11b are explanatory diagrams of a blur of bar chart obtained by a pair of focus detection pixels in the present embodiment.
Figure 11B:
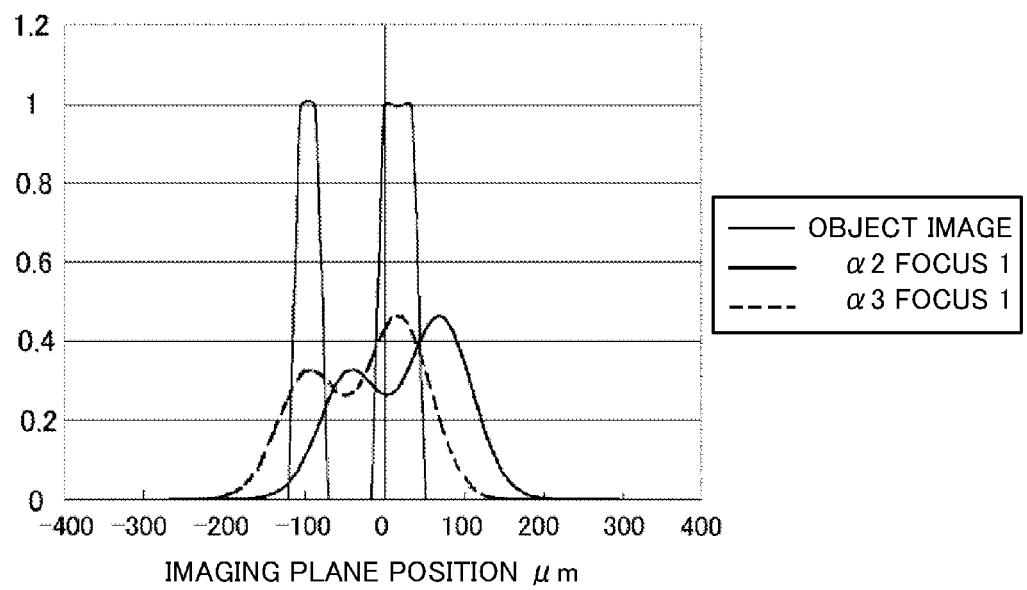

Next, referring to FIGS. 11A and 11B, a blur of two bar charts having different widths for an object image will be described. In FIG. 11A, as a representative of combinations in which the optical base length is long, a state of a blur of the bar charts in the combination of the focus detection pixels α2 and β2 with respect to a rear focus side is shown. In FIG. 11B, as a representative of combinations in which the optical base length is short, a state of a blur of the bar charts in the combination of the focus detection pixels α2 and α3 with respect to the rear focus side is shown.

As shown in FIGS. 11A and 11B, displaced widths of images of pairs of focus detection pixel groups on an imaging plane are different on condition that the images are similarly out of focus. In other words, as the optical base length is shorter, the displacement of the image is smaller. Accordingly, the focus detection sensitivity is higher because a displacement of a phase difference is larger as the optical base length is longer. When the focus detection viewing length is fixed, the focus detection can also be performed for a focus state having a larger defocus amount as the optical base length is shorter.

In order to improve the focus detection accuracy near the focus, it is necessary to improve the sensitivity with respect to a displacement of the focus, i.e. to elongate the optical base length. In this case, because the image is sharp near the focus, it is necessary to reduce the displacement of a pair of image sampling positions by which a phase difference image is detected as much as possible. This is because the intensity of the image is significantly changed even if the position displacement is small due to the shape image. Accordingly, it is preferable that the distance of the pair of focus detection pixel groups is as short as possible.

On the other hand, the sharpness of the image is deteriorated when the image includes a large amount of blur, and therefore the focus detection performance is not easily influenced even if the distance of the focus detection pixel group is long.

In the present embodiment, the distances of the pairs of the focus detection pixel groups α1-β1, α2-β2, and α3-β3 whose optical base lengths are long are set to L1 that corresponds to a distance between diagonal adjacent pixels, and the distances of the pairs of the focus detection pixel groups α1-α2, α2-α3, β1-β2, and β2-β3 whose optical base lengths are short are set to L2 that corresponds to a length of four pixels. Accordingly, ensuring the focus detection accuracy near the focus and improving the maximum defocus amount can be simultaneously realized.

In the present embodiment, the focus detection pixel group whose optical base length is short is selected by changing the combination of the focus detection pixel group whose optical base length is long. Therefore, the number of standard pixels for obtaining an image can be ensured without placing another focus detection pixel.

Further, in the present embodiment, because the combination of the focus detection pixels having different optical base lengths are defined by repeatedly using a single focus detection pixel, the position of the focus detection pixel whose optical base length is short is arranged in a direction different from a phase difference direction.

Next, referring to FIG. 12, a detection procedure of an out-of-focus amount (a defocus amount) that is a part of an autofocus will be described.

Figure 12:
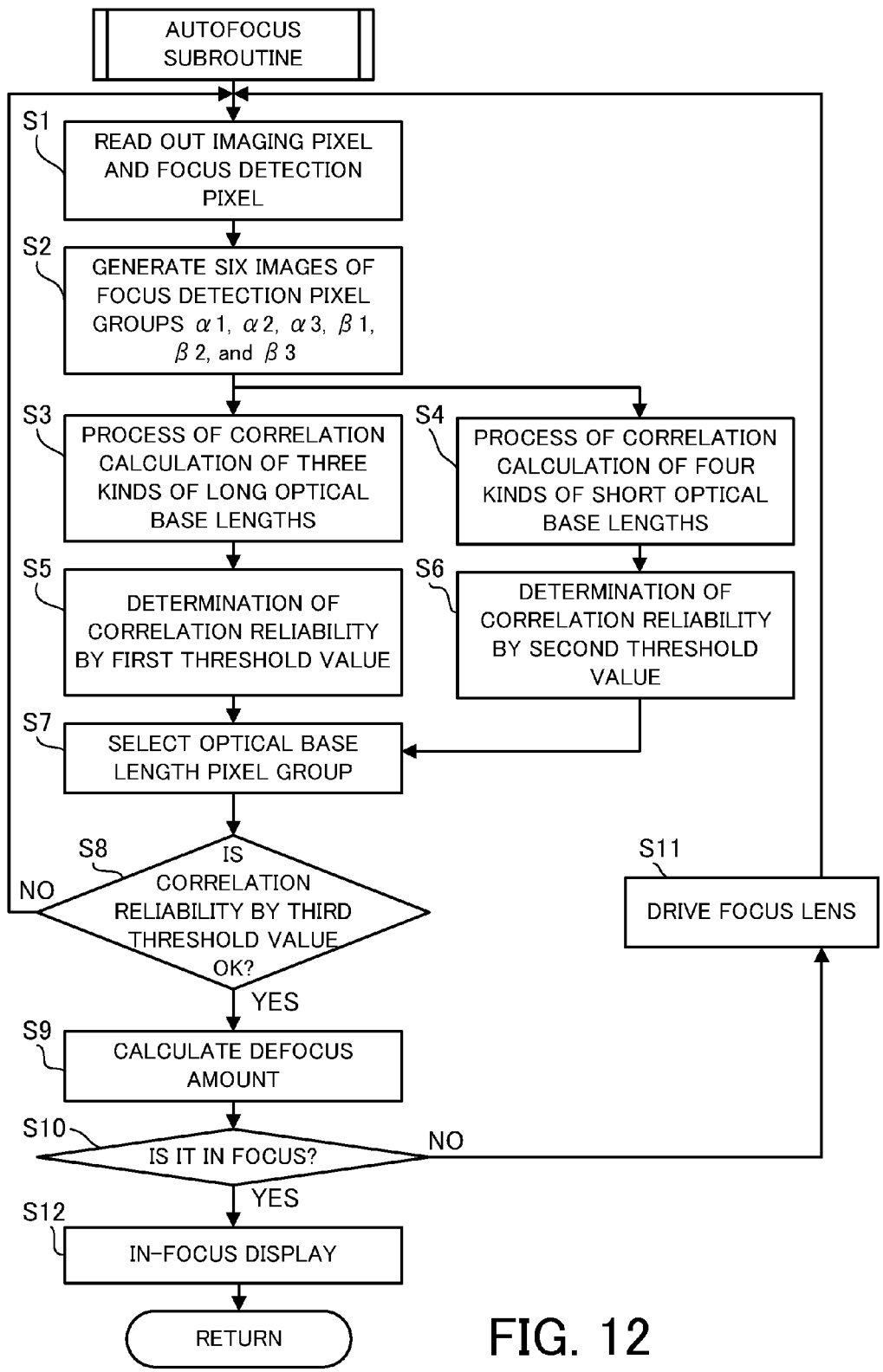
FIG. 12 is a flowchart showing a detection procedure of a defocus amount in Embodiment 1.

FIG. 12 is a flowchart showing a detection procedure of the out-of-focus amount (the defocus amount) in the present embodiment. Each procedure shown in FIG. 12 is performed based on an instruction of the CPU 121. FIG. 12 shows a subroutine of an autofocus. A main flow of the autofocus is omitted because it is the same as that of the procedure of a common camera.

First, when an autofocus function is selected by the operation switch 132, the imaging pixel and the focus detection pixel of the image pickup element 107 are read out in order to perform the focus detection in Step S1. In Step S2, six kinds of pattern images formed in a phase difference direction are generated using the six kinds of focus detection pixel groups (α1, α2, α3, β1, β2, and β3) described above. FIGS. 11A and 11B described above are an example of pattern images expressed by two bar charts having widths different from each other.

Next, in Step S3, correlation calculations of images (first pairs of image signals) of the three kinds of pairs of focus detection pixel groups (α1-β1, α2-β2, and α3-β3) whose optical base lengths are long are performed. In Step S4, correlation calculations of images (second pairs of image signals) of the four kinds of pairs of focus detection pixel groups (α1-α2, α2-α3, β1-β2, and β2-β3) whose optical base lengths are short are performed.

Next, in Steps S5 and S6, the selector of the CPU 121 determines a reliability of each of the correlation results of Steps S3 and S4. The reliability means a degree of coincidence of a pair of images (a correlation amount), a contrast of an image, or the like. When the degree of coincidence of the pair of images is favorable, it is determined that the reliability of the focus detection result is commonly high, and on the other hand, when the contrast is high, it is determined that the reliability as a focus detection target is high.

In Step S5, a determination portion performs a reliability evaluation by using a first threshold value with respect to three kinds of pairs of images (first pairs of image signals) whose optical base lengths are long. In Step S6, the determination portion performs the reliability evaluation by using a second threshold value stricter than the first threshold value with respect to four kinds of pairs of images (second pairs of image signals) whose optical base lengths are short. Thus, the determination portion determines the reliabilities of the first and second pairs of image signals on the bases different from each other.

Accordingly, near the focus, a focus detection pixel group having a pair of focus detection pixels whose optical base lengths are long tends to be selected, and focus detection accuracy can be ensured. On the other hand, in a state of a large amount of blur, a focus detection pixel group, which can take in a lot of information of an object image that is a target from a fixed focus detection viewing field, having a pair of focus detection pixels whose optical base lengths are short tends to be selected. Therefore, the maximum defocus amount can be improved.

Next, in Step S7, in accordance with the determinations in Steps S5 and S6, the selector in the CPU 121 selects one of the focus detection pixel group having a long optical base length and the focus detection pixel group having a short optical base length. In Step S8, for the focus detection pixel group selected by the selector, the correlation reliability is confirmed in details again. When it is determined that there is no reliability in Step S8, it is determined that the focus detection signal itself does not have the reliability and the flow returns to Step S1 to start over from reading out the image. On the other hand, when it is confirmed that there is the reliability in Step S8, the calculator of the CPU 121 converts a correlation value of an image (a pair of image signals) to the defocus amount (the out-of-focus amount) to calculate the defocus amount.

In Step S10, it is determined whether or not the defocus amount calculated by the calculator in Step S9 is equal to or less than a permissible value. When the defocus amount is equal to or greater than the permissible value, it is determined that the image is out of focus. Then, in Step S11, after a focus lens is driven so as to correct the defocus amount calculated in Step S9, Steps S1 to S10 are repeatedly performed. On the other hand, when it is determined that the image reaches an in-focus state in Step S10, the in-focus display is performed in Step S12 to get out of the autofocus subroutine.

As above, according to the present embodiment, the defocus amount is calculated based on a pair of image signals obtained from appropriate one of the focus detection pixel group having the long optical base length and the focus detection pixel group having the short optical base length. More specifically, a pair of image signals having a short optical length is selected with respect to an object having a large defocus amount, and a pair of image signals having the long optical base length is selected near the focus. Therefore, according to the optical device of the present embodiment, the maximum defocus amount can be improved and also the focus detection accuracy can be ensured near the focus.

Embodiment 2

Next, Embodiment 2 of the present invention will be described. In the present embodiment, a method of selecting a pair of images that have base lengths different from each other is different from that of Embodiment 1. Since other configurations of the optical device are the same as those of Embodiment 1, descriptions thereof will be omitted.

Figure 13:
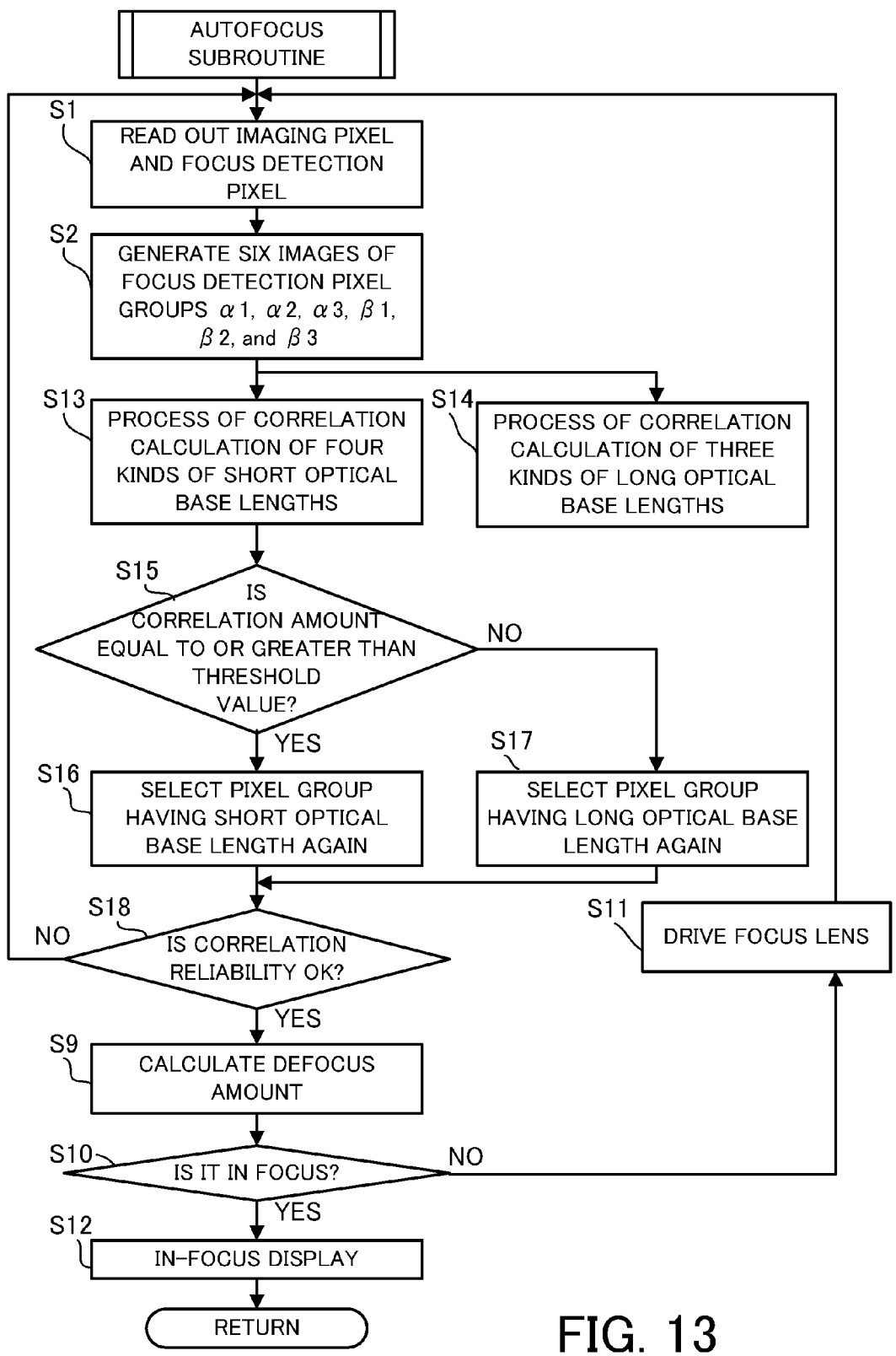
FIG. 13 is a flowchart showing a detection procedure of a defocus amount in Embodiment 2.

FIG. 13 is a flowchart showing a detection procedure of an out-of-focus amount (a defocus amount) that is a part of an autofocus in the present embodiment. Each step shown in FIG. 13 is, similarly to Embodiment 1, performed by an instruction of the CPU 121. FIG. 13 shows a subroutine of the autofocus, and its main flow is omitted since it is the same as that of a common camera.

First, when an autofocus function is selected by the operation switch 132, in order to perform focus detection, imaging pixels and focus detection pixels of the image pickup element 107 are read out in Step S1. In Step S2, six kinds of pattern images which are formed in a phase difference direction are created using the six kinds of focus detection pixels (α1, α2, α3, β1, β2, and β3) described above. Steps S1 and S2 of the present embodiment are the same as those of Embodiment 1.

Next, in Step S13, a correlation calculation of each image (second pair of image signals) of four kinds of pairs of focus detection pixel groups α1-α2, α2-α3, β1-β2, and β2-β3 whose optical base lengths are short is performed. Further, in Step S14, a correlation calculation of each image (first pair of image signals) of three kinds of pairs of focus groups α1-β1, α2-β2, and α3-β3 whose optical base lengths are long is performed.

Next, in Step S15, a correlation amount of an image by the focus detection pixel group having a short optical base length is confirmed. When the correlation amount is equal to or greater than a predetermined threshold value, generally, the correlation amount obtained by an image of the focus detection pixel group having a short optical base length has reliability higher than that obtained by an image of the focus detection pixel group having a long optical base length. On the other hand, when the correlation amount is smaller than the predetermined threshold value, the reliability of the correlation amount obtained by the image of the focus detection pixel group having high focus detection sensitivity and the long optical base length is higher.

Thus, one of the focus detection pixel groups having the long optical base length and the short optical base length is selected considering the correlation amount of an image as a predetermined threshold value. Therefore, when the correlation amount is equal to or greater than the predetermined value, i.e. a defocus amount of an object is large, the selector selects an image (a second pair of image signals) of the focus detection pixel group having the short optical base length (Step S16). On the other hand, when the correlation amount is smaller than the predetermined threshold value, i.e. near the focus, the selector selects an image (a first pair of image signal) of the focus detection pixel group having the long optical base length (Step S17).

In Step S18, the reliability of the correlation value is confirmed. When it is determined that there is no reliability, it is determined that a focus detection signal itself does not have reliability. In this case, the flow returns to Step S1 to start over from the read of an image.

When the reliability is confirmed in Step S18, the calculator converts the correlation value of the image obtained in Step S3 or S4 to a defocus amount to calculate the defocus amount (Step S9).

In Step S10, it is determined whether the defocus amount calculated in Step S9 is equal to or less than a permissible value. When the defocus amount is equal to or greater than the permissible value, it is determined that the image is out of focus. In this case, in Step S11, after the focus lens is driven so that the defocus amount calculated in Step S9 is corrected, Steps S1 to S10 are repeatedly performed. On the other hand, when it is determined that the image reaches an in-focus state in Step S10, an in-focus display is performed in Step S12 and the autofocus subroutine is finished. Steps S9 to S12 are the same as those of Embodiment 1.

As described above, according to the present embodiment, the defocus amount is calculated based on a pair of image signals obtained from appropriate one of the focus detection pixel groups having the long optical base length and the short optical base length. More specifically, the pair of image signals having the short optical base length is selected for an object having a large defocus amount, and on the other hand a pair of image signals having the long optical base length is selected near the focus. Therefore, according to the optical device of the present embodiment, the maximum defocus amount can be improved and also the focus detection accuracy can be ensured near the focus.

Embodiment 3

In Embodiment 3, a configuration of the optical device is the same as that of Embodiment 1, and a method of selecting a pair of images having different optical base lengths is different. Other configurations of the optical device are the same as those of Embodiment 1 and therefore descriptions thereof will be omitted.

Figure 14:
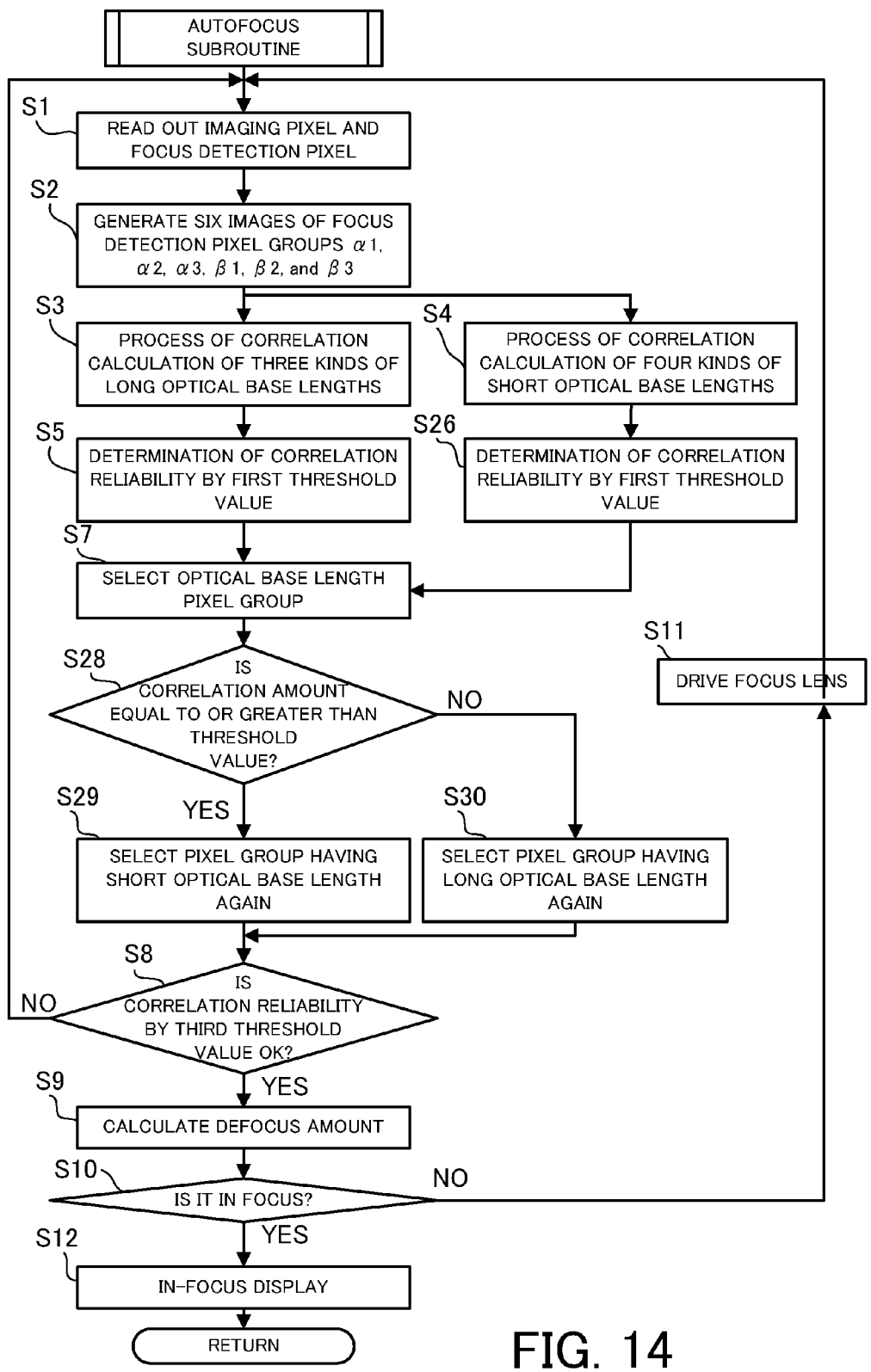
FIG. 14 is a flowchart showing a detection procedure of a defocus amount in Embodiment 3.
Figure 15:
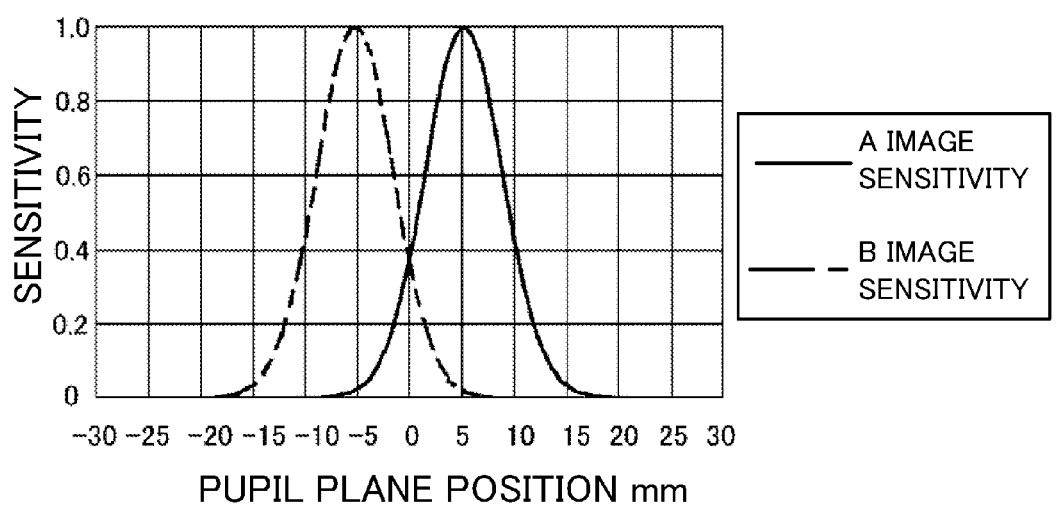
FIG. 15 is light sensitivity characteristics of a conventional focus detection pixel.
Figure 16A:
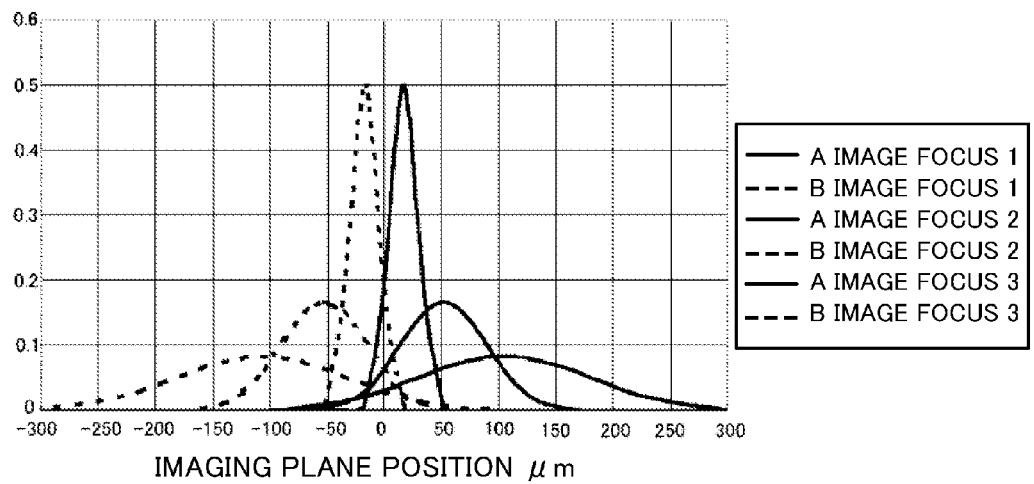
FIGS. 16A and 16B are explanatory diagrams of a blur of a line image obtained by a pair of conventional focus detection pixels.
Figure 16B:
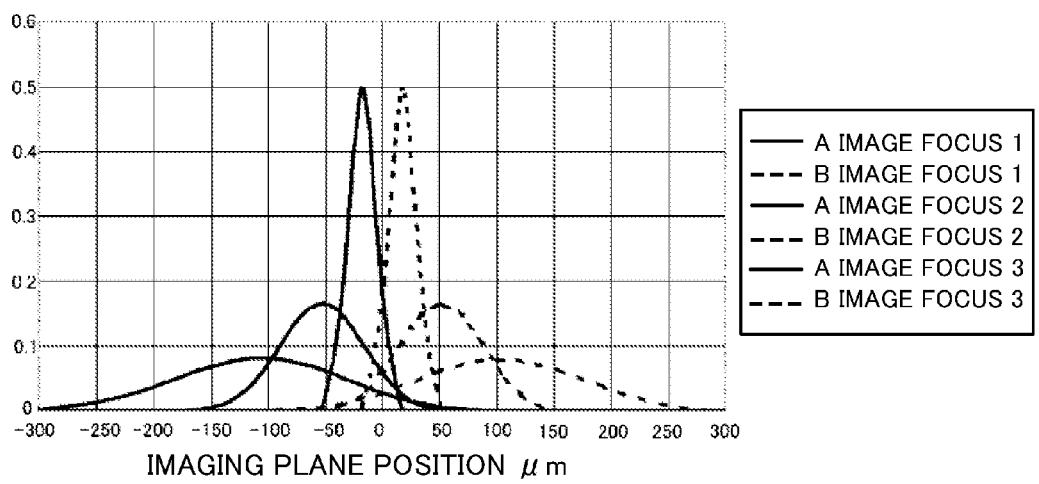

FIG. 14 is a flowchart showing a detection procedure of an out-of-focus amount (a defocus amount) that is a part of an autofocus in the present embodiment. Each step shown in FIG. 14 is, similarly to Embodiment 1, performed by an instruction of the CPU 121. FIG. 14 shows a subroutine of the autofocus, and its main flow is omitted since it is the same as that of a common camera.

First, when an autofocus function is selected by the operation switch 132, imaging pixels and focus detection pixels of the image pickup element 107 are read out in Step S1. In Step S2, six kinds of pattern images which are formed in a phase difference direction are created using the six kinds of focus detection pixels (α1, α2, α3, β1, β2, and β3) described above.

Next, in Step S3, the focus detector obtains images (first pairs of image signals) of the three kinds of pairs of focus detection pixel groups (α1-β1, α2-β2, and α3-β3) whose optical base lengths are long by performing a correlation calculation. In Step S4, the focus detector obtains images (second pairs of image signals) of the four kinds of pairs of focus detection pixel groups (α1-α2, α2-α3, β1-β2, and β2-β3) whose optical base lengths are short by performing the correlation calculation. Next, in Steps S5 and S6, the reliability of the correlation calculation results of Steps S3 and S4 (the correlation amount) is determined. In Step S5, a reliability evaluation with a first threshold value is performed with respect to three kinds of pairs of images having long optical base lengths.

Steps S1 to S5 described above are the same as those of Embodiment 1.

In Step S26, for the four kinds of pairs of images having short optical base lengths, a reliability evaluation is performed with a first threshold value which is the same as the threshold value in Step S5. As the optical base length of the pair of images is shorter, the correlation of the image is maintained. Therefore, commonly, four kinds of pairs of images having short optical base lengths are selected.

Next, in Step S7, based on determination results in Steps S5 and S6, one of the focus detection pixel groups is selected. In Step S28, a correlation amount of the selected focus detection pixel group is confirmed. When the correlation amount is equal to or greater than a predetermined value, a correlation amount of the focus detection pixel group having a short optical base length generally has reliability higher than that of the focus detection pixel group having a long optical base length. On the other hand, when the correlation amount is smaller than the predetermined threshold value, the reliability of the correlation amount of the focus detection pixel group having high focus detection sensitivity and a long optical base length is higher.

Accordingly, the selector selects one of the focus detection pixel groups considering a predetermined correlation amount as a threshold value. More specifically, the selector selects an image of the focus detection pixel group having a short optical base length with respect to an object having a large defocus amount (Step S29). On the other hand, the selector selects an image of the focus detection pixel group having a long optical base length near the focus (Step S30).

The following Steps S8 to S12 are the same as those of Embodiment 1, and therefore descriptions thereof will be omitted.

As described above, according to the present embodiment, the defocus amount is calculated based on an image signal obtained from appropriate one of the focus detection pixel groups having a long optical base length and a short optical base length. More specifically, a pair of image signals having a short optical base length is selected with respect to an object having a large defocus amount, and on the other hand a pair of image signals having a long optical base length is selected near the focus. Therefore, according to the optical device of the present embodiment, the maximum defocus amount can be improved and also the focus detection accuracy can be ensured near the focus.

In each of the above embodiments, a sensitivity center of a light receiving unit is displaced with respect to an optical axis of an on-chip micro lens of the image pickup element to perform a pupil division, but the embodiment is not limited to this. For example, the similar effect can also be obtained by performing two divisions of a pupil division of a light receiving unit of a part of pixels of the image pickup element disclosed in Patent Literature 3.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

100 IMAGING LENS
101 FIRST LENS GROUP
102 SHUTTER WITH APERTURE
103 SECOND LENS GROUP
105 THIRD LENS GROUP
106 OPTICAL LOW-PASS FILTER
107 IMAGE PICKUP ELEMENT
115 ILLUMINATION UNIT
121 CPU
131 DISPLAY
132 OPERATION SWITCH
133 FLASH MEMORY
200 CAMERA

The invention claimed is:

1. An optical device comprising:
an image pickup element which has a plurality of imaging pixels configured to perform a photoelectric conversion of an object image formed by a light beam emitted from an image pickup optical system and a plurality of focus detection pixels configured to perform a photoelectric conversion of two images formed by two divided light beams of the light beam emitted from the image pickup optical system;
a focus detector configured to obtain, from the plurality of focus detection pixels, first and second pairs of image signals having optical base lengths different from each other;
a selector configured to select one of the first and second pairs of image signals based on at least one correlation amount of the first and second pairs of image signals; and
a calculator configured to calculate a defocus amount based on the selected pair of image signals,
wherein a corresponding micro lens is arranged for each pixel of the plurality of imaging pixels and the plurality of focus detection pixels,
wherein the plurality of focus detection pixels include first, second and third focus detection pixels, each of which has a different opening center position,
wherein the focus detector obtains the first pair of image signals from the first and second focus detection pixels and obtains the second pair of image signals from the first and third focus detection pixels,
wherein the optical base length of the second pair of image signals is shorter than the optical base length of the first pair of image signals, and
wherein a distance between the first and third focus detection pixels is greater than a distance between the first and second focus detection pixels.

2. An optical device according to claim 1,
wherein the second and third focus detection pixels are arranged in a direction different from each other with respect to the first focus detection pixel and different from a phase difference direction.

3. An optical device according to claim 1, wherein centers of gravity of light sensitivities in the first, second, and third focus detection pixels are displaced from one another.

4. An optical device according to claim 3, wherein the second and third focus detection pixels are arranged in a direction different from a displacement direction of the center of gravity of the light sensitivity with respect to the first focus detection pixel.

5. An optical device according to claim 1, wherein the selector determines reliabilities of the correlation amounts of the first and second pairs of image signals on bases different from each other.

6. An optical device according to claim 1, wherein the selector selects the second pair of image signals when the correlation amount of the second pair of image signals is equal to or greater than a predetermined threshold value, and selects the first pair of image signals when the correlation amount of the first pair of image signals is smaller than the predetermined threshold value.

7. A signal processor used for an optical device including an image pickup element which has a plurality of imaging pixels configured to perform a photoelectric conversion of an object image formed by a light beam emitted from an image pickup optical system, and has a plurality of focus detection pixels configured to perform a photoelectric conversion of two images formed by two divided light beams of the light beam emitted from the image pickup optical system, the signal processor comprising:
a focus detector configured to obtain, from the plurality of focus detection pixels, first and second pairs of image signals having optical base lengths different from each other;
a selector configured to select one of the first and second pairs of image signals based on at least one correlation amount of the first and second pairs of image signals; and
a calculator configured to calculate a defocus amount based on the selected pair of image signals,
wherein a corresponding micro lens is arranged for each pixel of the plurality of imaging pixels and the plurality of focus detection pixels,
wherein the plurality of focus detection pixels include first, second and third focus detection pixels, each of which has a different opening center position,
wherein the focus detector obtains the first pair of image signals from the first and second focus detection pixels and obtains the second pair of image signals from the first and third focus detection pixels,
wherein the optical base length of the second pair of image signals is shorter than the optical base length of the first pair of image signals, and
wherein a distance between the first and third focus detection pixels is greater than a distance between the first and second focus detection pixels.

\* \* \* \* \*